US011910555B2

(12) United States Patent
Klaba et al.

(10) Patent No.: US 11,910,555 B2
(45) Date of Patent: Feb. 20, 2024

(54) RACK SYSTEM AND METHOD FOR POSITIONING A DATA CENTER RACK

(71) Applicant: OVH, Roubaix (FR)

(72) Inventors: Henryk Klaba, Roubaix (FR); Jules Hermann Bonenfant, Lys Lez Lannoy (FR); Valentin Cartigny, Mons-en-Baroeul (FR)

(73) Assignee: OVH, Roubaix (FR)

( * ) Notice: Subject to any disclaimer, the term of this patent is extended or adjusted under 35 U.S.C. 154(b) by 331 days.

(21) Appl. No.: 17/411,366

(22) Filed: Aug. 25, 2021

(65) Prior Publication Data
US 2022/0071043 A1 Mar. 3, 2022

(30) Foreign Application Priority Data

Aug. 31, 2020 (EP) .................................. 20315399

(51) Int. Cl.
*H05K 7/14* (2006.01)
*H05K 7/18* (2006.01)

(52) U.S. Cl.
CPC ............. *H05K 7/1488* (2013.01); *H05K 7/18* (2013.01)

(58) Field of Classification Search
CPC .... A47B 88/43; F16M 11/20; F16M 2200/08; G02B 6/4452; H04Q 1/08; H04Q 1/09; H05K 7/18; H05K 7/183; H05K 7/186; H05K 7/1427; H05K 7/1485; H05K 7/1488; H05K 7/1489; H05K 7/1497; H05K 7/20709
USPC .............................. 312/223.1, 223.2; 211/26
See application file for complete search history.

(56) References Cited

U.S. PATENT DOCUMENTS

| 3,356,432 | A  | * | 12/1967 | Mariotte | ................ | A47B 88/48 |
| | | | | | | 312/298 |
| D431,736 | S  | * | 10/2000 | O'Brien | ...................... | D6/682.2 |
| 6,202,570 | B1 | * | 3/2001 | Kurtsman | ................ | H04Q 1/08 |
| | | | | | | 211/187 |
| 6,220,456 | B1 | * | 4/2001 | Jensen | ...................... | G06F 1/16 |
| | | | | | | 361/829 |
| 6,439,523 | B1 | * | 8/2002 | Chandler, Jr. | ....... | G02B 6/4452 |
| | | | | | | 248/300 |
| 7,031,588 | B2 | * | 4/2006 | Cowley | ................ | G02B 6/4455 |
| | | | | | | 312/323 |

(Continued)

OTHER PUBLICATIONS

European Search Report with regard to the counterpart EP Patent Application No. 20315399.4 completed Feb. 12, 2021.

*Primary Examiner* — Joshua E Rodden
(74) *Attorney, Agent, or Firm* — BCF LLP

(57) ABSTRACT

A method is provided for positioning a data center rack relative to a rack-supporting frame. The method includes: affixing at least one left guiding member and at least one right guiding member to the to left and right vertical support units; affixing at least one front rack-locating member to a front side of the data center rack; lifting the data center rack; inserting the data center rack between the left and right vertical support units until the at least one front rack-locating member abuts front end surfaces of the vertical support units or the at least one left and right guiding members; affixing at least one rear rack-locating member to a rear side of the data center rack; and lowering the data center rack so that the front and rear rack-locating members are supported by the at least one left guiding member and the at least one right guiding member.

20 Claims, 17 Drawing Sheets

(56) References Cited

U.S. PATENT DOCUMENTS

| | | | | |
|---|---|---|---|---|
| 7,134,558 B1* | 11/2006 | Mimlitch, III | H05K 7/1489 | 211/189 |
| 7,301,756 B2* | 11/2007 | Wayman | H05K 7/1489 | 361/679.01 |
| 8,083,298 B2* | 12/2011 | Henderson | H05K 7/1489 | 312/334.4 |
| 8,705,926 B2* | 4/2014 | Giraud | G02B 6/44526 | 385/135 |
| 10,111,355 B1* | 10/2018 | Marrs | H05K 5/0221 | |
| 2004/0074852 A1* | 4/2004 | Knudsen | G02B 6/3825 | 211/26 |
| 2005/0284033 A1* | 12/2005 | Chen | H05K 7/1489 | 52/64 |
| 2008/0093958 A1* | 4/2008 | Peterson | H04Q 1/064 | 312/223.1 |
| 2010/0140195 A1* | 6/2010 | Henderson | H05K 7/1489 | 211/13.1 |
| 2011/0103760 A1* | 5/2011 | Cote | G02B 6/4452 | 385/135 |
| 2011/0268406 A1* | 11/2011 | Giraud | G02B 6/4452 | 385/135 |
| 2012/0024803 A1* | 2/2012 | Replogle | H04Q 1/09 | 29/401.1 |
| 2012/0155034 A1* | 6/2012 | Hsiao | H05K 7/1489 | 361/726 |
| 2014/0204497 A1* | 7/2014 | Martinez Sanchez | H05K 7/186 | 361/119 |
| 2018/0278171 A1 | 9/2018 | Collette et al. | | |

* cited by examiner

RACK SYSTEM AND METHOD FOR POSITIONING A DATA CENTER RACK

CROSS-REFERENCE

The present application claims priority from European Patent Application No. 20315399.4, filed on Aug. 31, 2020, the entirety of which is incorporated by reference herein.

FIELD OF TECHNOLOGY

The present technology relates to rack systems for data centers and to methods for positioning data center racks.

BACKGROUND

Data centers incorporate various racks which can support different types of equipment such as computing equipment (e.g., servers), network equipment, power equipment and/or cooling equipment. In some cases, these racks can be supported by a rack-supporting frame, particularly when the racks are to be positioned above one another.

However, properly positioning the racks on a rack-supporting frame so as to avoid weight imbalances on the rack-supporting frame can be challenging. Notably, in many cases, an operator of a forklift or other lifting machine for handling the racks is guided by another person to properly position the racks on the rack-supporting frame. In addition to being a time-consuming process, relying on the visual observation of the position of the rack on the rack-supporting frame may not be ideal as it can be subjective to the person observing the rack.

There is therefore a desire for a rack system which can alleviate at least some of these drawbacks.

SUMMARY

It is an object of the present technology to ameliorate at least some of the inconveniences present in the prior art.

According to one aspect of the present technology, there is provided a method for positioning a data center rack relative to a rack-supporting frame. The rack-supporting frame includes left and right vertical support units laterally spaced apart from one another. The method includes: affixing at least one left guiding member to the left vertical support unit such that: part of one of the at least one left guiding member extends frontwardly from a front end surface of the left vertical support unit; and part of one of the at least one left guiding member extends rearwardly from a rear end surface of the left vertical support unit; affixing at least one right guiding member to the right vertical support unit such that: part of one of the at least one right guiding member extends frontwardly from a front end surface of the right vertical support unit; and part of one of the at least one right guiding member extends rearwardly from a rear end surface of the right vertical support unit; affixing at least one front rack-locating member to a front side of the data center rack; lifting the data center rack; inserting the data center rack between the left and right vertical support units until the at least one front rack-locating member abuts one of (i) the front end surfaces of the left and right vertical support units, and (ii) the at least one left guiding member and the at least one right guiding member; affixing at least one rear rack-locating member to a rear side of the data center rack; and lowering the data center rack so that: the at least one front rack-locating member is supported by the at least one left guiding member and the at least one right guiding member; and the at least one rear rack-locating member is supported by the at least one left guiding member and the at least one right guiding member.

In some embodiments, a lateral position of the data center rack between the left and right vertical support units is guided by interaction between the at least one front and at least one rear rack-locating members with the at least one left and at least one right guiding members.

In some embodiments, each of the at least one front rack-locating member and each of the at least one rear rack-locating member has a locating feature for locating the at least one left guiding member and the at least one right guiding member relative thereto; and lowering the data center rack comprises engaging the at least one left guiding member and the at least one right guiding member with the locating feature of the at least one front rack-locating member and the locating feature of the at least one rear rack-locating member.

In some embodiments, engaging the at least one left guiding member and the at least one right guiding member with the locating feature of the at least one front rack-locating member and the locating feature of the at least one rear rack-locating member automatically guides the lateral position of the data center rack between the left and right vertical support units.

In some embodiments, the locating feature is a V-shaped notch; and engaging the at least one left guiding member and the at least one right guiding member with the notches of the at least one front rack-locating member of the at least one rear rack-locating member automatically guides the at least one left guiding member and the at least one right guiding member toward an apex of each of the notches so as to guide the lateral position of the data center rack between the left and right vertical support units.

In some embodiments, each of the at least one front rack-locating member has a first locating feature for locating at least one of the at least one left guiding member and the at least one right guiding member relative thereto; and the data center rack is inserted between the left and right vertical support units so as to engage the at least one left guiding member and the at least one right guiding member with the first locating feature of the at least one front rack-locating member.

In some embodiments, each of the at least one rear rack-locating member has a second locating feature for locating the at least one left guiding member and the at least one right guiding member relative thereto; and the method further comprises: prior to affixing the at least one rear rack-locating member to the rear side of the data center rack, placing the at least one rear rack-locating member in engagement with the at least one left guiding member and the at least one right guiding member in order for the second locating feature of each of the at least one rear rack-locating member to engage a corresponding one of the at least one left guiding member and the at least one right guiding member.

In some embodiments, the first locating feature is a guide opening; and said engaging the at least one left guiding member and the at least one right guiding member with the first locating feature of the at least one front rack-locating member comprises inserting part of one of the at least one left guiding member and part of one of the at least one right guiding member into the respective guide opening of each of the at least one front rack-locating member.

In some embodiments, the second locating feature is a guide opening; and said engaging of the guiding opening of each of the at least one rear rack-locating member with the corresponding one of the at least one left guiding member and the at least one right guiding member comprises inserting part of one of the at least one left guiding member and part of one of the at least one right guiding member into the respective guide opening of each of the at least one rear rack-locating member.

In some embodiments, the at least one left guiding member includes a front left guiding member and a rear left guiding member; the at least one right guiding member includes a front right guiding member and a rear right guiding member; affixing the at least one left guiding member to the left vertical support unit comprises: affixing the front left guiding member to the left vertical support unit such that at least part of the front left guiding member extends frontwardly from the front end surface of the left vertical support unit; and affixing the rear left guiding member to the left vertical support unit such that at least part of the rear left guiding member extends rearwardly from the rear end surface of the left vertical support unit; and affixing the at least one right guiding member to the right vertical support unit comprises: affixing the front right guiding member to the right vertical support unit such that at least part of the front right guiding member extends frontwardly from the front end surface of the right vertical support unit; and affixing the rear right guiding member to the right vertical support unit such that at least part of the rear right guiding member extends rearwardly from the rear end surface of the right vertical support unit.

In some embodiments, the at least one front rack-locating member includes a front left rack-locating member and a front right rack-locating member; and affixing the at least one front rack-locating member to the front side of the data center rack comprises: affixing the front left rack-locating member to a left end portion of the data center rack on the front side of the data center rack; and affixing the front right rack-locating member to a right end portion of the data center rack on the front side of the data center rack.

In some embodiments, the at least one rear rack-locating member includes a rear left rack-locating member and a rear right rack-locating member; and affixing the at least one rear rack-locating member to the rear side of the data center rack comprises: affixing the rear left rack-locating member to a left end portion of the data center rack on the rear side of the data center rack; and affixing the rear right rack-locating member to a right end portion of the data center rack on the rear side of the data center rack.

According to another aspect of the present technology, there is provided a rack system. The rack system includes: a rack-supporting frame comprising a left vertical support unit and a right vertical support unit laterally spaced from one another; at least one left guiding member connected to the left vertical support unit such that: part of one of the at least one left guiding member extends frontwardly from a front end surface of the left vertical support unit; and part of one of the at least one left guiding member extends rearwardly from a rear end surface of the left vertical support unit; at least one right guiding member connected to the right vertical support unit such that: part of one of the at least one right guiding member extends frontwardly from a front end surface of the right vertical support unit; and part of one of the at least one right guiding member extends rearwardly from a rear end surface of the right vertical support unit; a data center rack positioned between the left and right vertical support units of the rack-supporting frame; at least one front rack-locating member connected to a front side of the data center rack, the at least one front rack-locating member being supported by the at least one left guiding member and the at least one right guiding member; and at least one rear rack-locating member connected to a rear side of the data center rack, the at least one rear rack-locating member being supported by the at least one left guiding member and the at least one right guiding member, each of the at least one front rack-locating member and each of the at least one rear rack-locating member having a locating feature for locating the at least one left guiding member and the at least one right guiding member relative thereto.

In some embodiments, a rear surface of each one of the at least one front rack-locating member abuts one of (i) the front end surface of at least one corresponding one of the left and right vertical support units, and (ii) at least one corresponding one of the at least one left guiding member and the at least one right guiding member.

In some embodiments, the locating feature automatically guide the lateral position of the data center rack between the left and right vertical support units.

In some embodiments, the locating feature is a V-shaped notch; and the at least one left guiding member and the at least one right guiding member are guided toward an apex of each of the notches so as to guide the lateral position of the data center rack between the left and right vertical support units.

In some embodiments, the at least one front rack-locating member includes a front left rack-locating member and a front right rack-locating member; the front left rack-locating member is connected to a left end portion of the data center rack on the front side of the data center rack; and the front right rack-locating member is connected to a right end portion of the data center rack on the front side of the data center rack.

In some embodiments, the at least one rear-rack locating member includes a rear left rack-locating member and a rear right rack-locating member; the rear left rack-locating member is connected to a left end portion of the data center rack on the rear side of the data center rack; and the rear right rack-locating member is connected to a right end portion of the data center rack on the rear side of the data center rack.

In some embodiments, the locating feature is a guide opening; and part of one of the at least one left guiding member and part of one the at least one right guiding member are inserted into a respective guide opening of each of the at least one front rack-locating member and each of the at least one rear rack-locating member.

In some embodiments, the part of each of the at least one left guiding member and the part of each of the at least one right guiding member protrudes frontwardly from the front end surface of a respective one of the left vertical support unit and the right vertical support unit.

In some embodiments, the at least one left guiding member includes a front left guiding member and a rear left guiding member; the at least one right guiding member includes a front right guiding member and a rear right guiding member; at least part of the front left guiding member extends frontwardly from the front end surface of the left vertical support unit; at least part of the rear left guiding member extends rearwardly from the rear end surface of the left vertical support unit; at least part of the front right guiding member extends frontwardly from the front end surface of the right vertical support unit; and at least part of the rear right guiding member extends rearwardly from the rear end surface of the right vertical support unit.

Implementations of the present technology each have at least one of the above-mentioned objects and/or aspects, but do not necessarily have all of them. It should be understood that some aspects of the present technology that have resulted from attempting to attain the above-mentioned objects may not satisfy these objects and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

In the present description, various terms relating to spatial orientation such as "front", "rear", "top", "bottom", "left", "right", "upward", "downward", etc. will be used to provide a clear description of the present technology. However, it is understood that these terms are merely used to improve the clarity of the description and in no way are meant to be limiting in regard to orientation.

Figure 1:
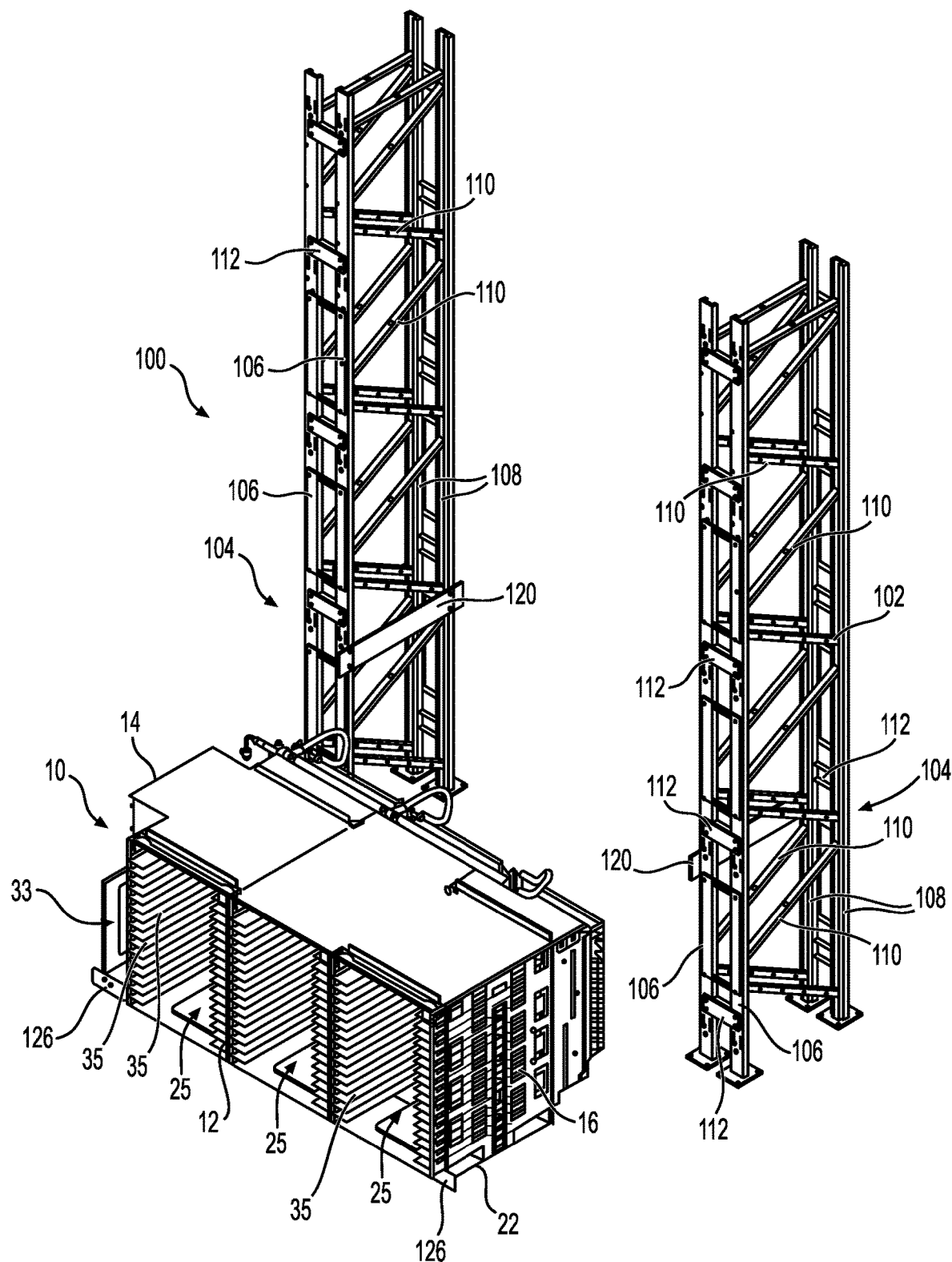
FIG. 1 is a perspective view of a rack system in accordance with an embodiment of the present technology.

FIG. 1 illustrates a rack system 100 for a data center including a rack-supporting frame 102 and a plurality of racks 10 (only one of which is shown in FIG. 1) that are configured to be supported by the rack-supporting frame 102. The rack-supporting frame 102 is provided to align the racks 10 in a row as is a common practice in data centers, notably to help manage heat within the data center. In use, a data center would include multiple rack-supporting frames 102 to form multiple rows of racks 10. The racks 10 are configured to support data center equipment therein, including for example computer systems such as servers and related supporting equipment (e.g., heat exchangers for heat dissipation of the computer systems). As such, the racks 10 may be referred as "data center racks".

The rack-supporting frame 102 includes multiple vertical support units 104, only two of which are shown in FIG. 1. As can be seen, the vertical support units 104 are laterally spaced from one another and are anchored to a ground surface of the data center. The rack-supporting frame 102 is designed so that the width of one rack 10 can fit between each pair of the vertical support units 104. As will be explained in more detail below, multiple racks 10 (e.g., two or three racks) can be disposed above one another between each pair of the vertical support units 104.

Figure 5:
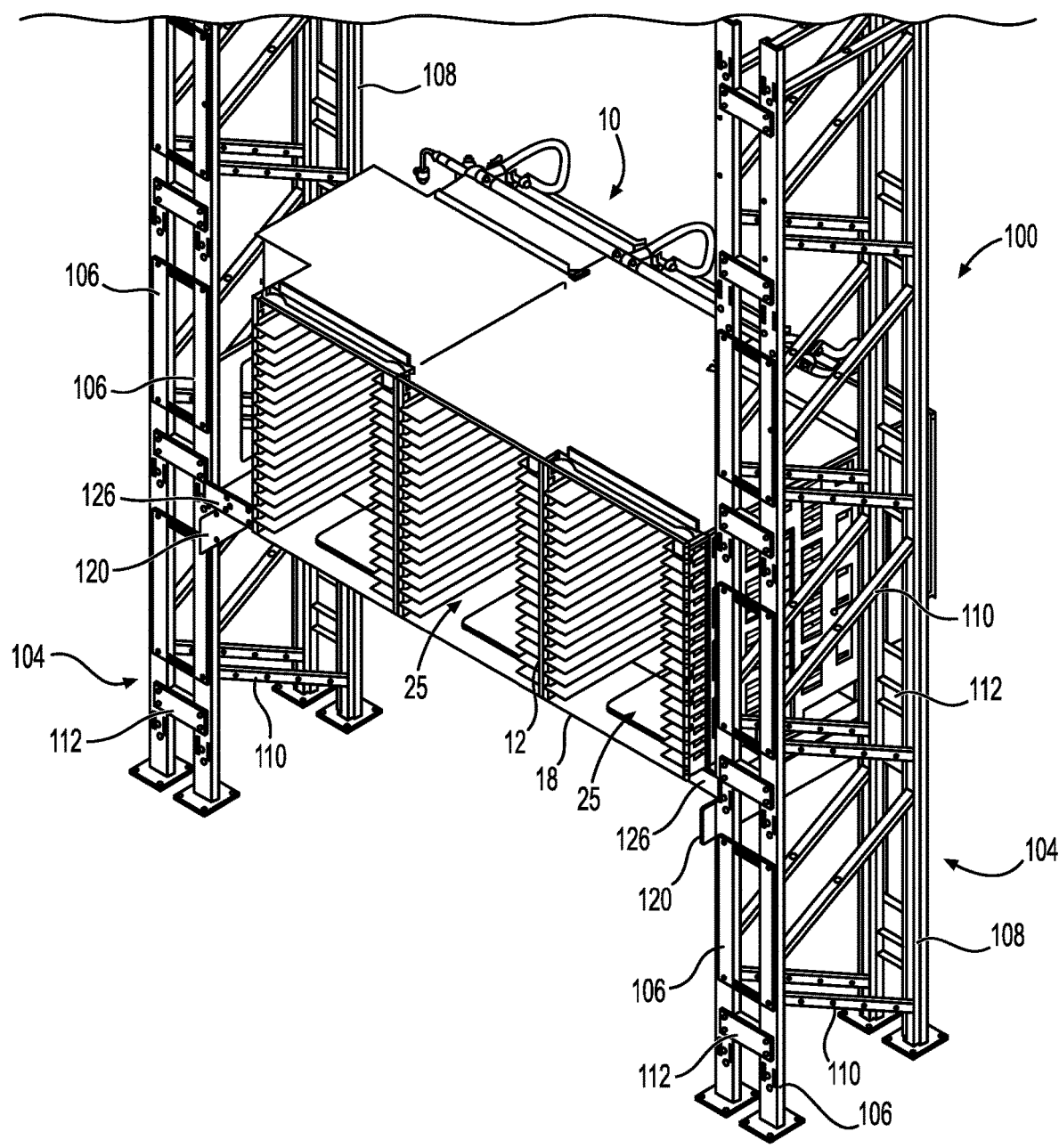
FIG. 5 is a perspective view, taken from a front, right side, of the rack and a rack-supporting frame of the rack system of FIG. 1, showing the rack being inserted between left and right vertical support units of the rack-supporting frame.

With reference to FIGS. 1 and 5, each vertical support unit 104 includes two front elongated vertical members 106, two rear elongated vertical members 108 and a plurality of front-to-rear elongated members 110 that extend in part in a depth direction (i.e., front-to-rear direction) of the rack-supporting frame 102 and interconnect the front and rear elongated vertical members 108. A plurality of laterally-extending members 112 extend between the front elongated vertical members 106 as well as between the rear elongated vertical members 108. In this embodiment, the front-to-rear elongated members 110 extend generally diagonally. In particular, each front-to-rear elongated member 110 extends either upwardly and rearwardly or downwardly and rearwardly from one of the two front vertical members 106 to a corresponding one of the two rear vertical members 108 that is laterally aligned with that front vertical member 106.

Figure 2:
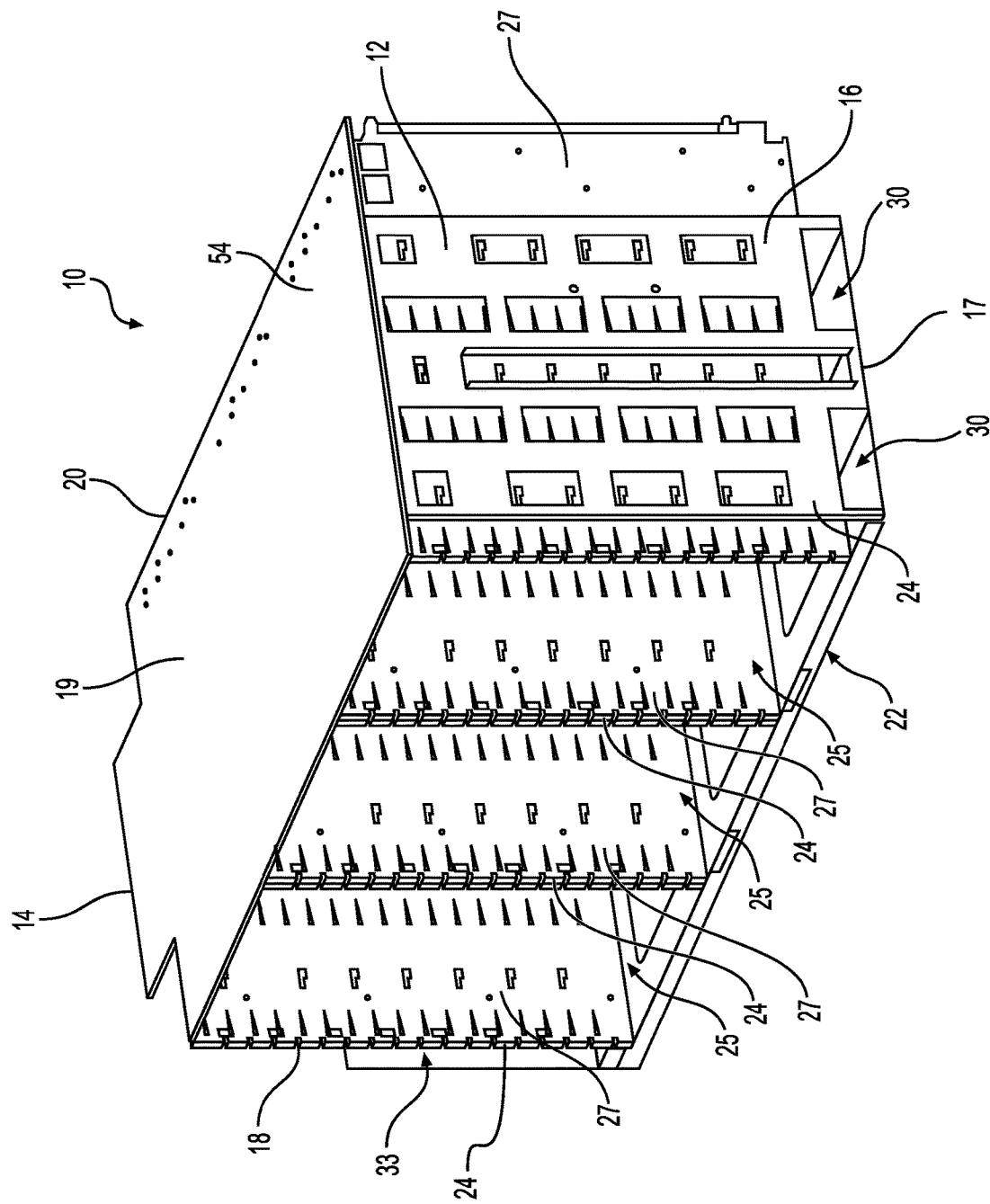
FIG. 2 is a perspective view, taken from a front, right side, of a rack of the rack system of FIG. 1.
Figure 3:
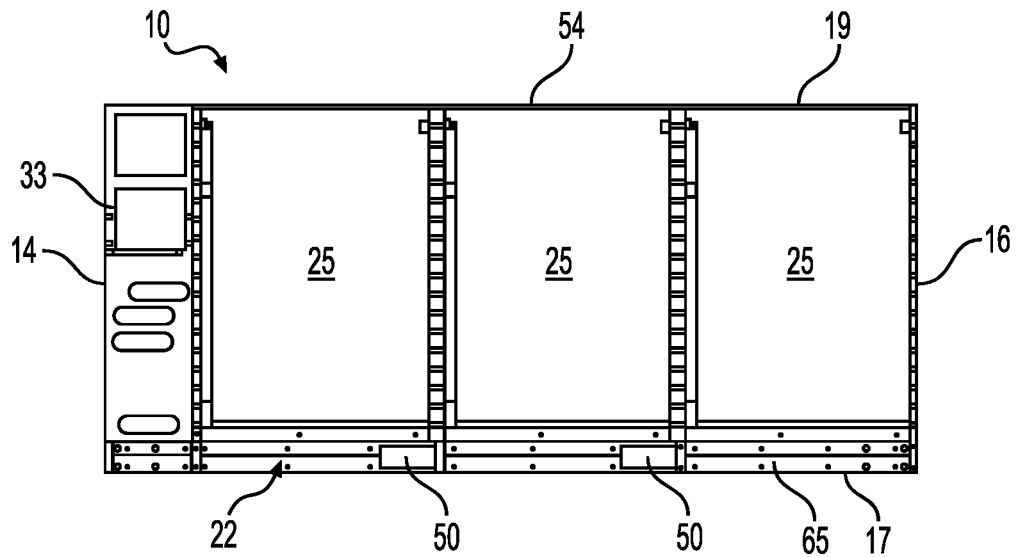
FIG. 3 is a front elevation view of the rack of FIG. 2.
Figure 4:
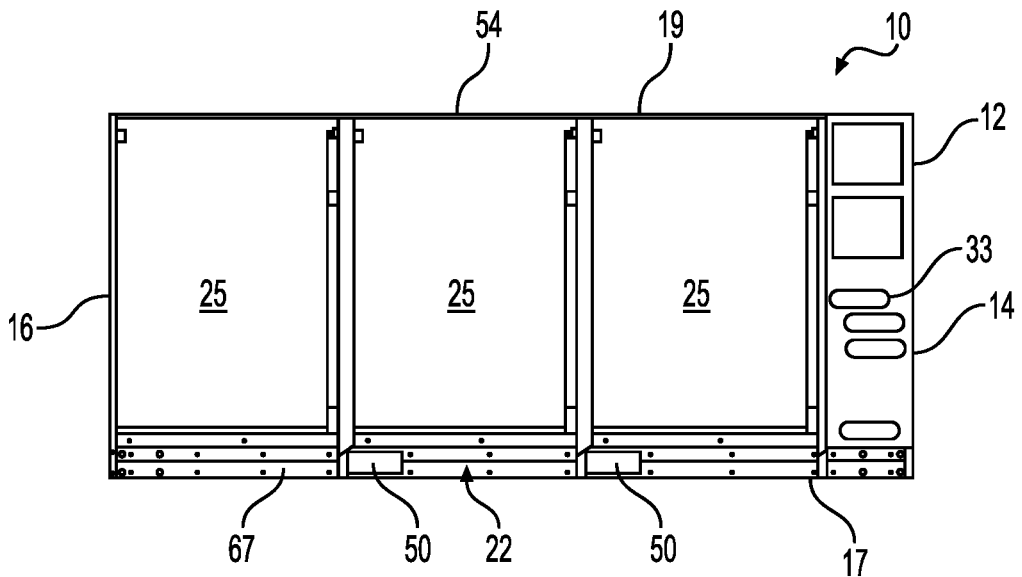
FIG. 4 is a rear elevation view of the rack of FIG. 2.

With reference to FIGS. 2 to 4, each rack 10 has a left lateral end 14 and a right lateral end 16 which are opposite one another in the lateral direction. A front end 18 is disposed on a front side of the rack 10 and a rear end 20 on a rear side of the rack 10. As can be seen, the rack 10 has a greater width, measured between the lateral ends 14, 16, than a height thereof, measured between a lower end 17 and an upper end 19 of the rack 10. As such, the rack 10 can be said to be horizontally-extending rather than vertically-extending.

The frame 12 of the rack 10 has a base 22 defining a bottom portion of the rack 10. The base 22 has a front wall 65 on the front side of the rack 10 and a rear wall 67 on the rear side of the rack 10. The frame 12 also has a plurality of vertical wall supports 24 that are fastened to the base 22 and extend upwardly therefrom. The vertical wall supports 24 are laterally spaced from one another so as to define housing sections 25 therebetween. In this embodiment, the frame 12 includes four vertical wall supports 24 which define three housing sections 25 between adjacent ones of the vertical wall supports 24. Vertical panels 27 are connected to each vertical wall support 24 and extend parallel thereto. Each vertical panel 27 is provided with a plurality of mounts for rails (not shown) onto which the servers can be mounted. A portion of each vertical panel 27 extends rearward of the rear ends of the vertical wall supports 24 and forms in part an enclosure for air flow through heat exchangers 75 (shown in FIG. 7) installed at the rear end of the rack 10.

In this embodiment, at the left lateral end 14, the frame 12 has an end frame enclosure 33 for housing additional equipment to service the servers supported by the rack 10 (e.g., a pumping module to pump cooling water to the servers if they are water-cooled). The end frame enclosure 33 includes two sheet metal components that are mechanically fastened to the base 22 and extend upwardly therefrom. The end frame enclosure 33 may be omitted in other embodiments.

An upper frame member 54 extending parallel to the base 22 and defining at least in part the upper end 19 of the rack 10 interconnects the upper ends of the vertical wall supports 24 as well as the upper end of the end frame enclosure 33. Notably, as can be seen, the upper frame member 54 is a generally planar sheet metal component that is fastened to the upper ends of the vertical wall supports 24 and the upper end of the components of the end frame enclosure 33.

The rack 10 is designed to be lifted by a forklift or other lifting machine having a fork (e.g., a stacker or a pallet jack). To that end, as shown in FIG. 2, the base 22 defines two openings 50, extending from the front wall 65 of the base 22 on the front side of the rack 10 to the rear wall 65 of the base 22 on the rear side of the rack 10, for receiving a fork of the lifting machine along the depth direction. More specifically, each opening 50 can receive a respective arm of the fork of the lifting machine. As shown in FIGS. 3 and 4, in this embodiment, the rack 10 also defines two openings 30 extending in the lateral direction, from one lateral end of the base 22 to the opposite lateral end of the base 22, for receiving a fork of the lifting machine along the lateral direction.

As mentioned above, the rack 10 is designed so as to fit between two of the vertical support units 104, namely a left vertical support unit 104 and a right vertical support unit 104. To that end, as will now be described in detail, a method for positioning the rack 10 relative to the rack-supporting frame 102 is provided herein.

Figure 10:
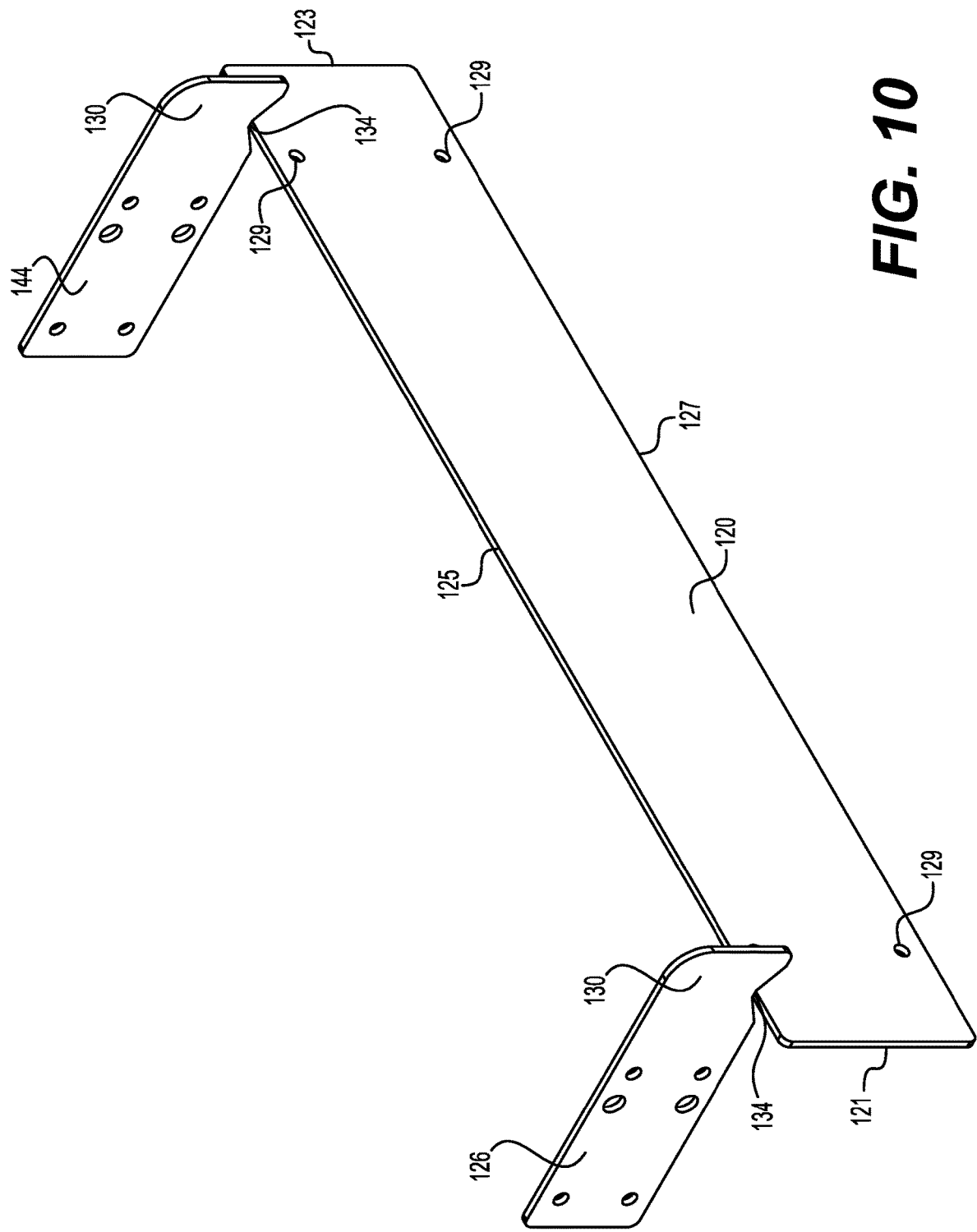
FIG. 10 is a perspective view showing front right and rear right rack-locating members supported by a right guiding member.

As shown in FIG. 1, a left guiding member 120 and a right guiding member 120 are affixed to the left vertical support unit 104 and the right vertical support unit 104 respectively. As can be seen, the left and right guiding members 120 are positioned at the same height as one another so that they are aligned in the vertical direction. In this embodiment, each of the left and right guiding members 120 is a generally rectangular planar component made from sheet metal. As shown in FIG. 10 for the right guiding member 120, each of the left and right guiding members 120 has a front edge 121, a rear edge 123, an upper edge 125 and a lower edge 127. The upper and lower edges 125, 127 are longer than the front and rear edges 121, 123. Each of the left and right guiding members 120 defines a plurality of openings 129 for receiving fasteners (e.g., screw or bolts) therein to connect the guiding members 120 to the vertical support units 104. The left and right guiding members 120 are connected to the laterally innermost vertical members 106, 108 of each vertical support unit 104 (i.e., the vertical members 106, 108 closest to the rack 10 when the rack 10 is in position between the vertical support units 104). The guiding members 120, in addition to helping position the rack 10 on the rack-supporting frame 102, may also help provide further rigidity to the rack-supporting frame 102 by linking the front and rear vertical members 106, 108. The left and right guiding members 120 are positioned so that a planar surface thereof extends vertically along the depth direction of the rack-supporting frame 102 (i.e., parallel to a vertical plane extending in the depth direction) and the upper and lower edges 125, 127 extend horizontally along the depth direction.

Figure 7:
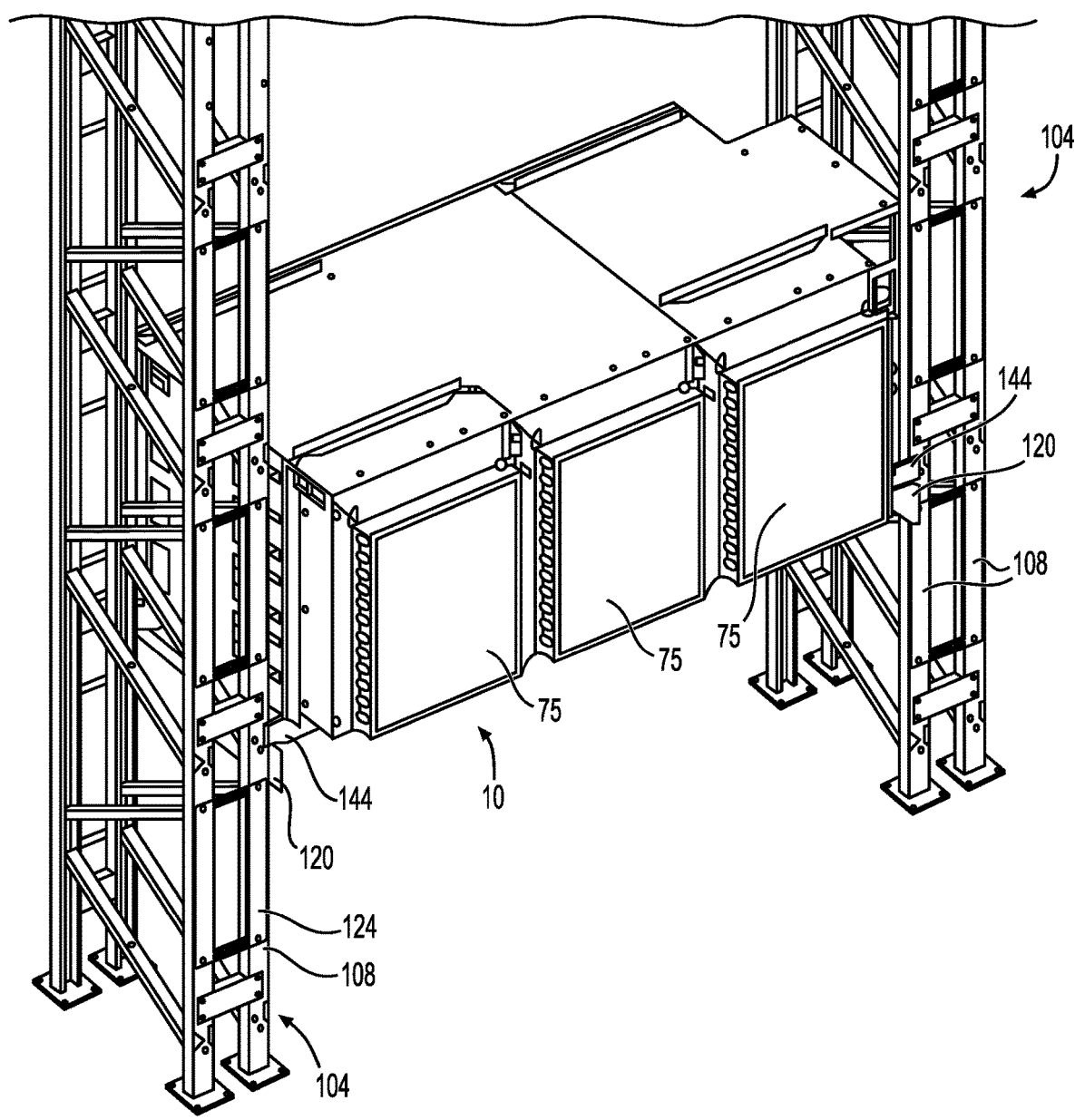
FIG. 7 is a perspective view, taken from a rear, right side, of the rack and rack-supporting frame of FIG. 1, showing rear rack-locating members being affixed to the rack.

In this embodiment, part of the left guiding member 120 extends frontwardly from a front end surface 122 of the left vertical support unit 104. Notably, the front end surface 122 is the surface of either one the front vertical members 106 of the left vertical support unit 104 that faces frontwardly (and is thus furthest from the rear vertical members 108). Moreover, as shown in FIG. 7, part of the left guiding member 120 extends rearwardly from a rear end surface 124 of the left vertical support unit 104. The rear end surface 124 is the surface of either one of the rear vertical members 108 of the left vertical support unit 104 that faces rearwardly.

Similarly, part of the right guiding member 120 extends frontwardly from a front end surface 122 of the right vertical support unit 104 (i.e., the surface of either one of the front vertical members 106 of the right vertical support unit 104 that faces frontwardly), and part of the right guiding member 120 extends rearwardly from a rear end surface 124 of the right vertical support unit 104 (i.e., the surface of either one of the rear vertical members of the right vertical support unit 104).

Two front rack-locating members 126 are then affixed to the front side of the rack 10. In particular, with the rack 10 either supported on a ground surface or lifted by a forklift or other lifting machine (with the fork received in the openings 50 of the rack 10), a front left rack locating member 126 and a front right rack-locating member 126 are affixed to the front wall 65 of the base 22 of the rack 10. As shown in FIG. 1, when the front rack-locating members 126 are affixed to the rack 10, a part of each of the front rack-locating members 126 extends beyond (i.e., laterally outwardly from) a respective lateral end of the base 22.

Figure 6:
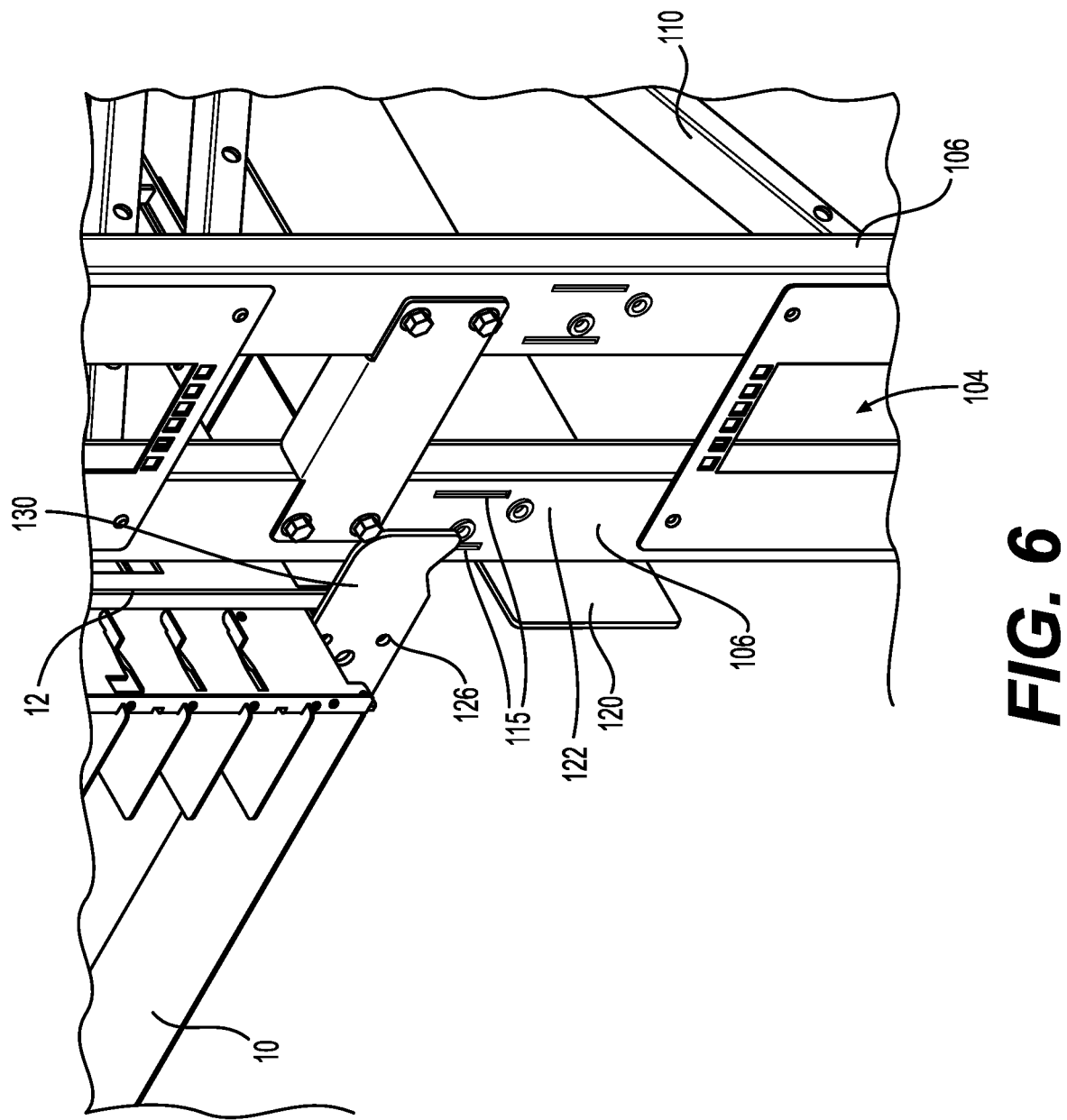
FIG. 6 is a detailed view of part of FIG. 5, namely showing a front rack-locating member abutted against a corresponding vertical support unit.
Figure 12:
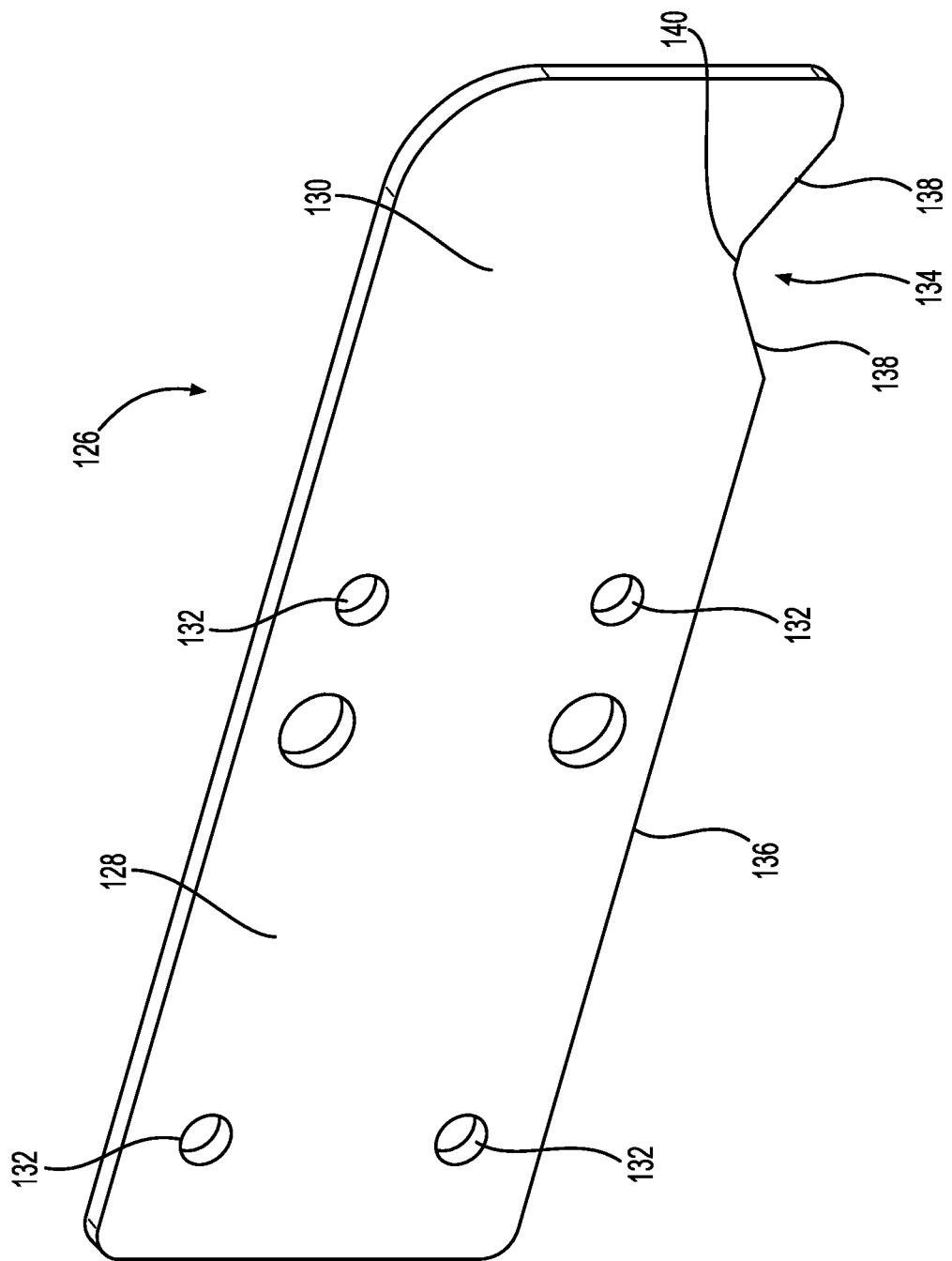
FIG. 12 is a perspective view of one of the rack-locating members.

In this embodiment, the front left and front right rack-locating members 126 are identical to one another and therefore only the front right rack-locating member 126 will be described in detail herein. It is to be understood that the same description applies to the front left rack-locating member 126. As shown in FIG. 12, the front rack-locating member 126 is a plate member that is generally planar and includes a connecting portion 128 and an extending portion 130. The connecting portion 128 defines a plurality of openings 132 through which fasteners are inserted to connect the front rack-locating member 126 to the base 22 of the rack 10. As shown in FIG. 6, the extending portion 130 is that portion of the front rack-locating member 126 that extends past the right lateral end of the base 22 when the front rack-locating member 126 is connected to the base 22. As shown in FIG. 12, in this embodiment, as will be explained in more detail below, the extending portion 130 has a locating feature 134 for locating a corresponding guiding member 120 relative to the front rack-locating member 126. In this embodiment, the locating feature 134 is a notch provided at a lower edge 136 of the front rack-locating member 126. The notch 134 is V-shaped, namely being defined by two angled edges 138 converging toward an apex 140.

Although in this embodiment two separate front rack-locating members 126 are provided, it is contemplated that, in other embodiments, a single front rack-locating member 126 could be provided which extends from both lateral ends of the base 22 of the rack 10, with each extending portion defining a respective notch 134.

Returning now to FIG. 5, with the front rack-locating members 126 affixed to the base 22 of the rack 10, the rack 10 is lifted by the lifting machine so that the base 22 and the front rack-locating members 126 are positioned vertically higher than the guiding members 120. The operator of the lifting machine then manoeuvres the lifting machine so that the rack 10 is aligned to be between the left and right vertical support units 104 in the lateral direction and the rack 10 is then inserted between the left and right vertical support units 104 in a front-to-rear motion direction. That is, the rack 10 is moved between the left and right vertical support units 104 with the rear end 20 facing rearwardly and the front end 18 facing frontwardly. As best shown in FIG. 6 for the right side of the rack 10, the rack 10 is inserted between the left and right vertical support units 104 in this direction until the rear surfaces (not shown) of the front left and front right rack-locating members 126 abut the front end surfaces 122 of the left and right vertical support units 104 respectively. In this position, the front left and front right rack-locating members 126 are in contact with the front end surfaces 122 of the left and right vertical support units 104 and disposed vertically higher than the guiding members 120. Moreover, the abutment of the front rack-locating members 126 with the front end surfaces 122 of the vertical support units 104 limits the position of the rack 10 along the depth direction, thereby ensuring that a center of gravity of the rack 10 is positioned appropriately along the depth direction to prevent significant weight imbalances in that direction (i.e., avoiding the rack 10 being too far rearward or too far frontward relative to the rack-supporting frame 102).

Figure 8:
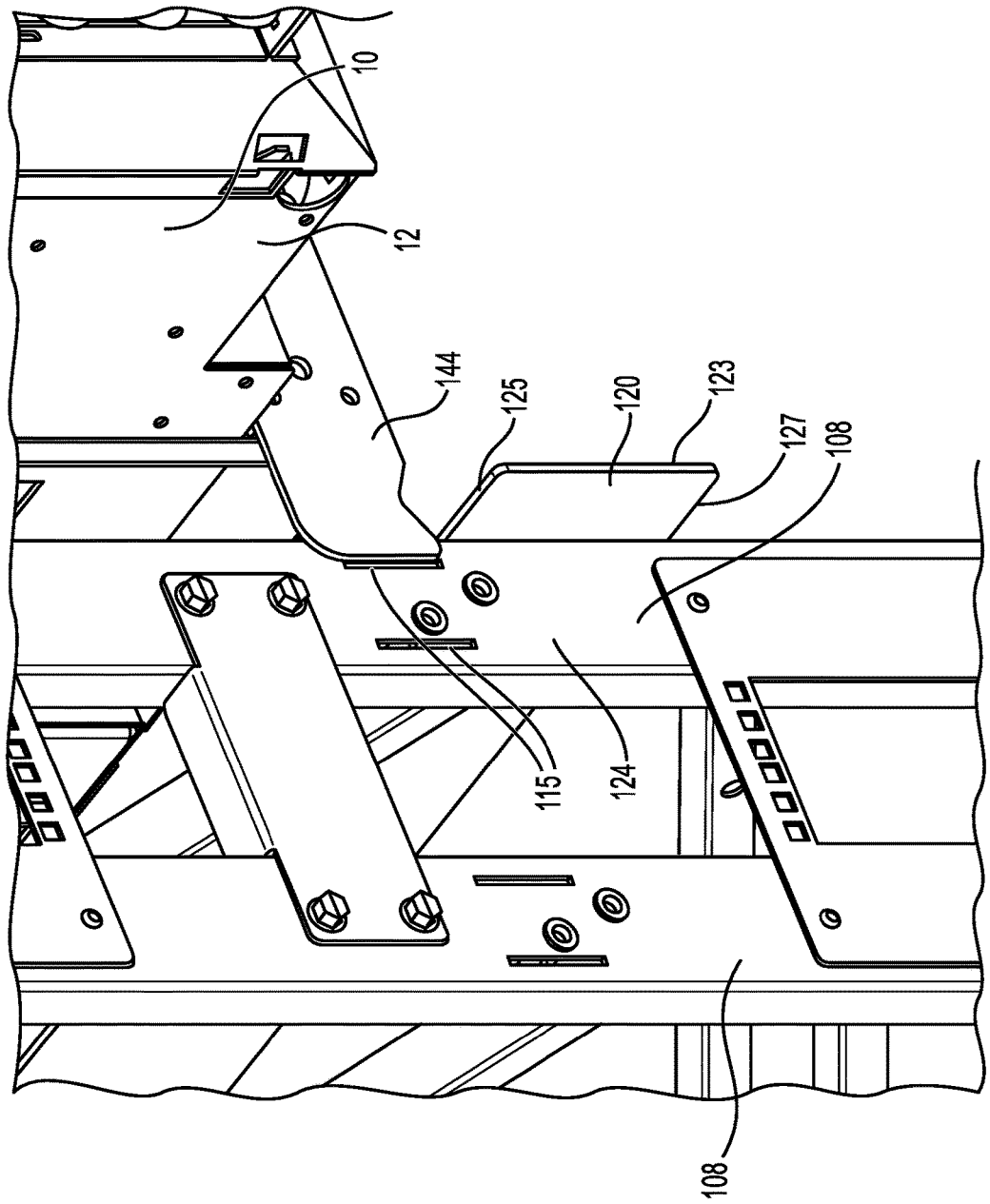
FIG. 8 is a detailed view of part of FIG. 7.

With reference to FIG. 7, with the front left and front right rack-locating members 126 in contact with the front end surfaces 122 of the left and right vertical support units 104, two rear rack-locating members 144 are then affixed to the rear side of the rack 10. In particular, a rear left rack-locating member 144 and a rear right rack-locating member 144 are connected to the rear wall 67 of the base 22 on the rear side of the rack 10. As shown in FIG. 8 for the rear right rack-locating member 144, when the rear rack-locating members 144 are affixed to the rack 10, a part of each of the rear rack-locating members 144 extends beyond (i.e., laterally outwardly from) a respective lateral end of the base 22.

In this embodiment, the rear rack-locating members 144 are configured identically to the front rack-locating members 126 and therefore will not be described in more detail herein as reference can be made to the description of the front rack-locating members 126 above.

At this point, the operator operates the lifting machine to lower the rack 10 so that the front rack-locating members 126 are supported by the left and right guiding members 120 and the rear rack-locating members 144 are supported by the left and right guiding members 120. This position of the rack 10 is shown in FIG. 9 for the front right rack-locating member 126.

Figure 9:
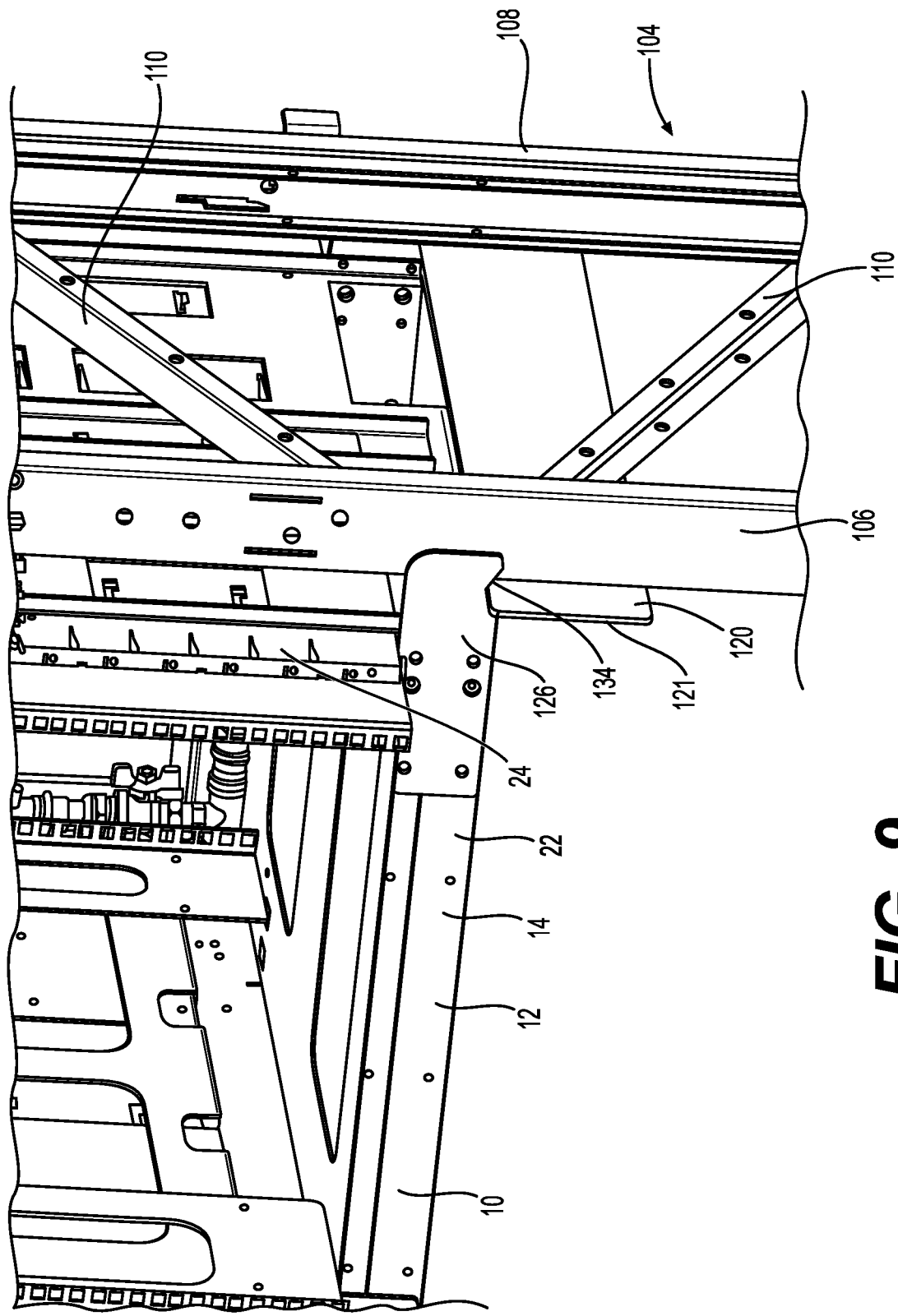
FIG. 9 is a perspective view of part of the rack and rack-supporting frame of FIG. 1, showing one of the front rack-locating members being supported by a corresponding guiding member affixed to the rack-supporting frame.
Figure 11:
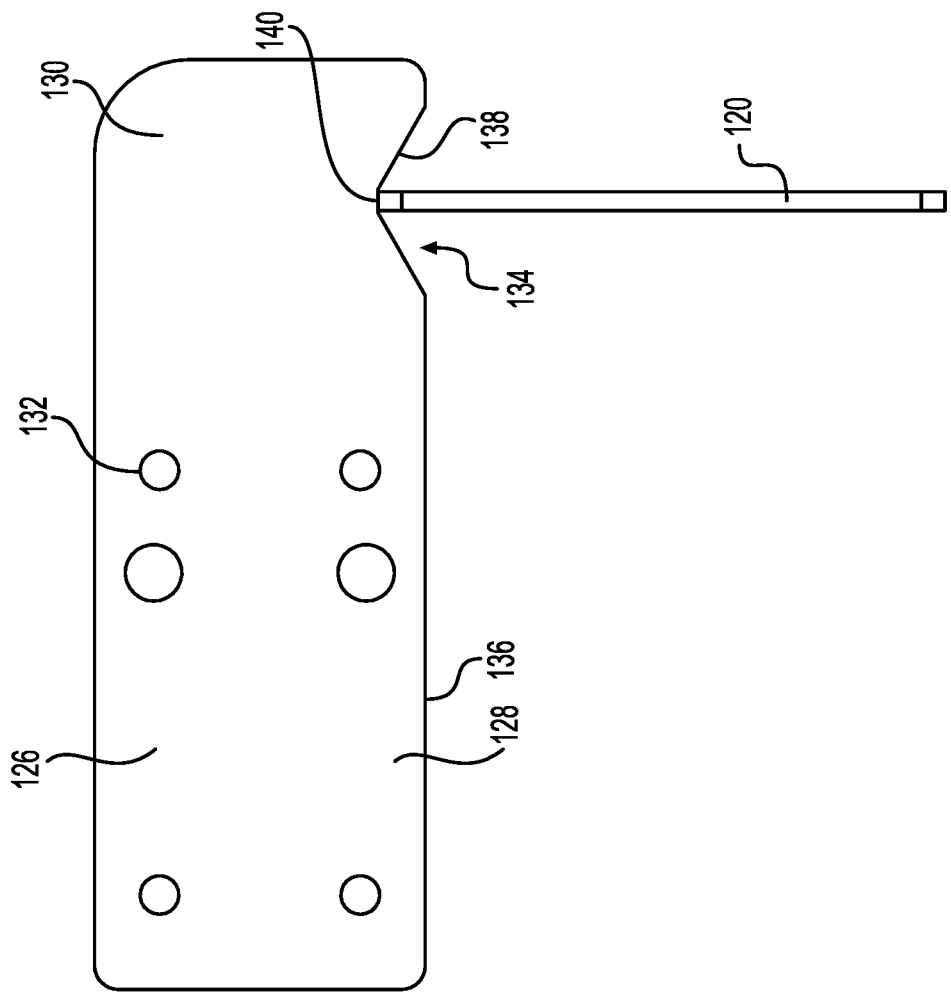
FIG. 11 is a front elevation view of the front right and rear right rack-locating members and the right guiding member of FIG. 10.

With reference to FIGS. 9 to 11, a lateral position of the rack 10 between the left and right vertical support units 104 is guided by interaction between the front and rear rack-locating members with the guiding members 120. More specifically, when the rack 10 is lowered to be supported by the guiding members 120, the left and right guiding members 120 engage the notches 134 of the front and rear rack-locating members 126, 144 which automatically guides the lateral position of the rack 10 between the left and right vertical support units 104. In particular, this engagement between the left and right guiding members 120 and the front and rear rack-locating members 126, 144 automatically guides the left guiding member 120 and the right guiding member 120 toward the apex 140 of a corresponding one of the notches 134 so as to guide the lateral position of the rack 10 between the left and right vertical support units 104. That is, when the rack 10 is lowered and the apexes 140 of the notches 134 are not laterally aligned with the guiding members 120, the guiding members 120 engage the angled edges 138 of the notches 134 which causes the guiding members 120 to ride up toward the apexes 140 thereby causing the rack 10 to self-center between the left and right vertical support units 140 in the lateral direction.

The rack 10 is thus supported by the rack-supporting frame 102 and aligned relative thereto (both in the lateral direction and the depth direction) via the guiding members 120 and the front and rear rack-locating members 126, 144. Depending on how many racks 10 are to be disposed above one another, the operator can then proceed to repeat the steps of the method to position another rack 10 above the rack 10 that is already in place. The method thus provides a simple and time-efficient manner in which a rack can be positioned on the rack-supporting frame 102 while ensuring that it is properly aligned relative to the vertical support units 104. The alignment of the rack 10 relative to the rack-supporting frame 102 can be particularly useful in ensuring that the weight of the rack 10 is properly distributed, thereby avoiding significant weight imbalances which could be hazardous for instance when manipulating equipment housed by the rack 10 (e.g., the servers, heat exchangers, etc.). Moreover, the method allows positioning the racks 10 in predetermined positions in a repeatable manner which can facilitate connecting equipment supported by the racks 10 (e.g., servers, heat exchangers, etc.) to respective connections such as a power supply connection, a fluid supply connection and other connections which might otherwise be difficult to connect if the racks 10 are not properly aligned relative to the rack-supporting frame 102.

In some embodiments, once the rack-locating members 126, 144 are supported by the guiding members 120, the rack-locating members 126, 144 may be fastened to the respective vertical support units 104. Notably, this may be helpful to prevent the rack 10 from tilting frontwards or rearwards. For instance, when removing servers from the rack 10 from the front side thereof, the center of gravity of the rack 10 can be shifted frontwardly due to weight of the servers. Therefore, preventing the tilting of the rack 10 can ensure safe maintenance operations on the rack 10.

An alternative embodiment of the method will now be described with reference to FIGS. 13 to 18. In this alternative embodiment, rather than affixing the left and right guiding members 120 described above to the left and right vertical support units 104, four separate guiding members 220 are affixed to the vertical support units 104. Notably, front left and rear left guiding members 220 are affixed to the left vertical support unit 104, and front right and rear right guiding members 220 are affixed to the right vertical support unit 104.

Figure 13:
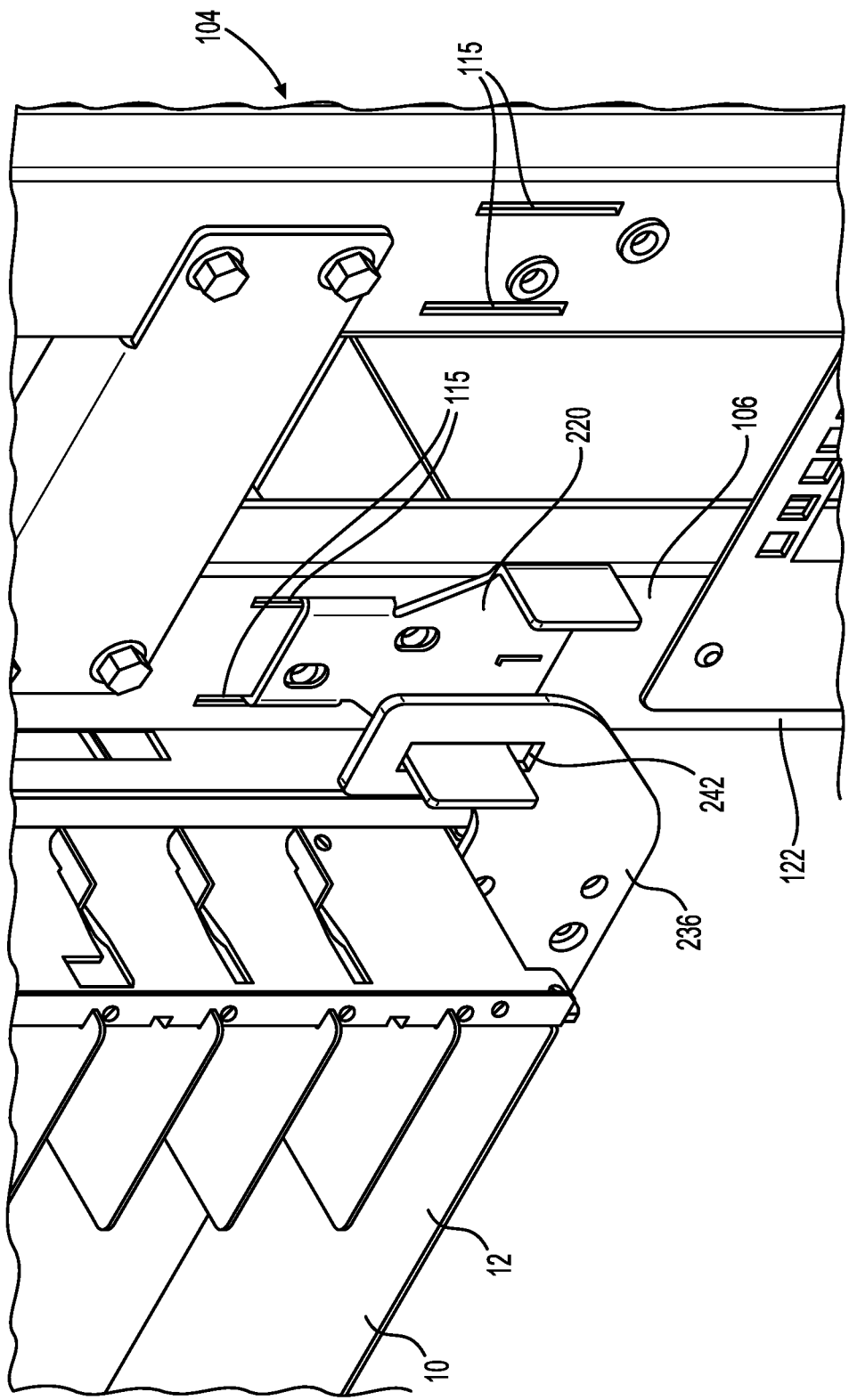
FIG. 13 is a perspective view of part of the rack and rack-supporting frame in accordance with another embodiment of the rack system, showing another type of rack-locating member and another type of guiding member for positioning the rack relative to the rack-supporting frame.
Figure 14:
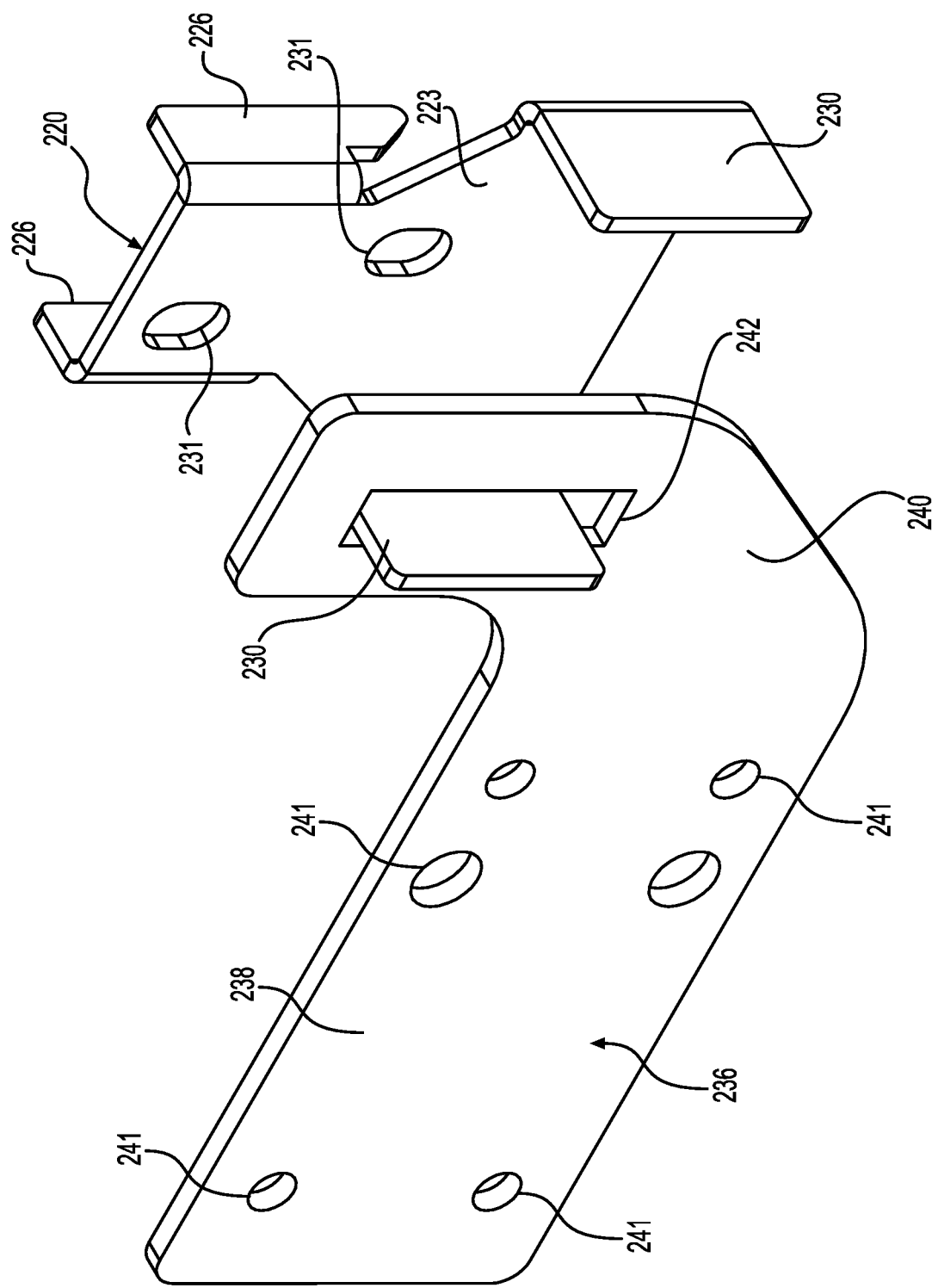
FIG. 14 is a perspective view of the rack-locating member and guiding member of FIG. 13.

As shown in FIG. 13, the front right guiding member 220 is affixed to a laterally innermost one of the front vertical members 106 of the right vertical support unit 104 such that part of the front right guiding member 220 extends frontwardly from the front end surface 122 of the right vertical support unit 104 defined by the front vertical member 106. Similarly, the front left guiding member 220 is affixed to a laterally innermost one of the front vertical members 106 of the left vertical support unit 104 such that part of the front left guiding member 220 extends frontwardly from the front end surface 122 of the left vertical support unit 104 defined by the front vertical member 106.

Meanwhile, the rear right guiding member 220 is affixed to the laterally innermost one of the rear vertical members 108 of the right vertical support unit 104 such that part of the rear right guiding member 220 extends rearwardly from the rear end surface 124 of the right vertical support unit 104 defined by the rear vertical member 108. Similarly, the rear left guiding member 220 is affixed to the laterally innermost one of the rear vertical members 108 of the left vertical support unit 104 such that part of the rear left guiding member 220 extends rearwardly from the rear end surface 124 of the left vertical support unit 104 defined by the rear vertical member 108.

Figure 18:
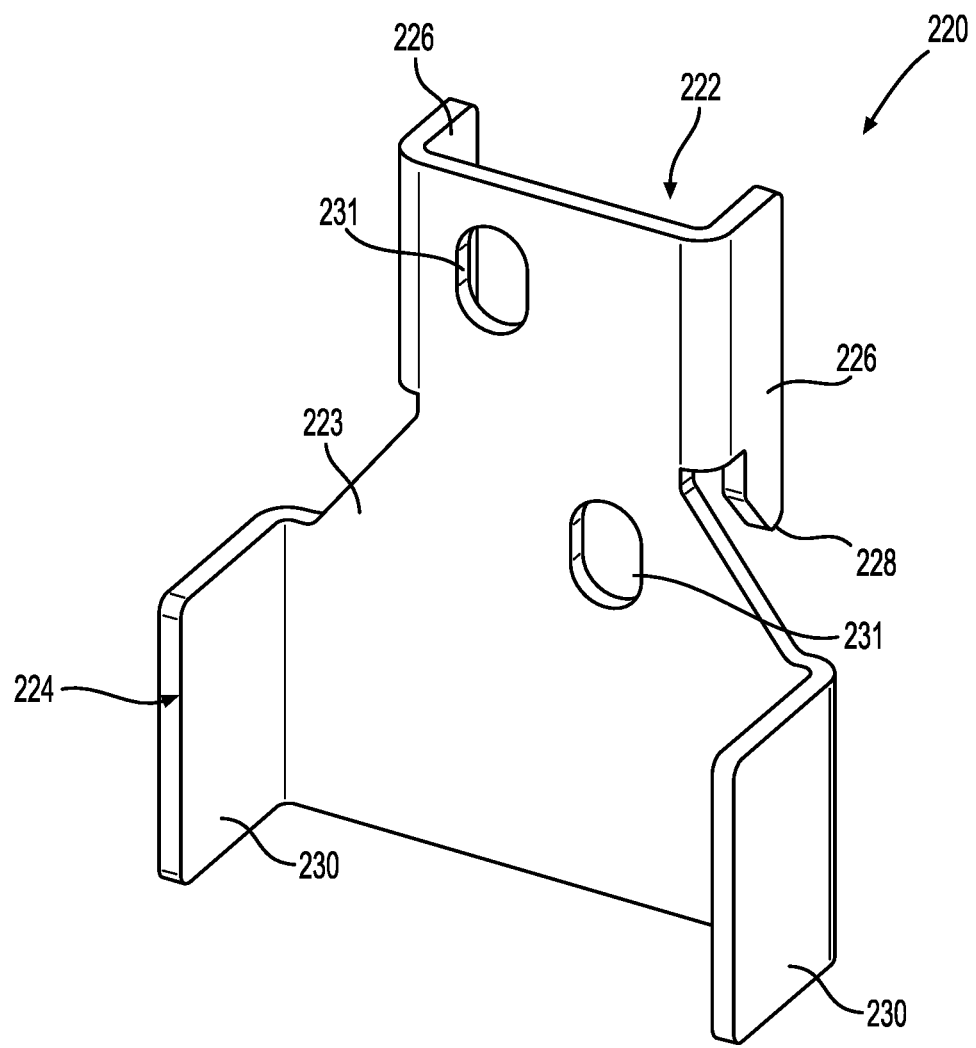
FIG. 18 is a perspective view of the guiding member of FIG. 14.

With reference to FIG. 18, each of the guiding members 220 has a planar central body portion 223, a frame connecting portion 222 extending rearwardly from the central body portion 223 and a rack-engaging portion 224 extending frontwardly from the central body portion 223. The frame connecting portion 222 is configured to connect the guiding member 220 to a corresponding one of the front or rear vertical members 106, 108. To that end, the frame connecting portion 222 includes two hooks 226 extending vertically, parallel to one another. Notably, each hook 226 has a tip 228 defining a lower end of the hook 226. The rack-engaging portion 224 includes two generally rectangular projections 230 that are parallel to one another. Each projection 230 protrudes frontwardly from the central body portion 223. The projections 230 are disposed vertically lower than the hooks 226 of the frame connecting portion 222.

In this embodiment, each guiding member 220 is a single integral component made of bent sheet metal. As such, the guiding members 220 can be manufactured easily and relatively inexpensively.

In order to affix one of the guiding members 220 to the corresponding front or rear vertical member 106, 108, the two hooks 226 of the guiding member 220 are inserted into two parallel slots 115 defined by each of the vertical members 106, 108 and the guiding member 220 is then moved downwardly to hook onto the corresponding front or rear vertical member 106, 108. The tips 228 of the hooks 226 are thus disposed below the lower ends of the slots 115 which prevents accidental removal guiding member 220 from the corresponding front or rear vertical member 106, 108. For additional safety, the guiding member 220 can then be fastened to the corresponding front or rear vertical member 106, 108 by mechanical fasteners (e.g., bolts) which are received in openings 231 defined by the central body portion 223 of the guiding member 220.

Furthermore, in this alternative method, in place of the rack-locating members 126, 144 described above, four rack-locating members 236 are used, including front left and front right rack-locating members 236 and rear left and rear right rack-locating members 236. In particular, the two front rack-locating members 236 are affixed to the front side of the rack 10. In particular, the front left and front right rack-locating members 236 are affixed to the front wall 65 of the base 22, at the left end and right end portions of the rack 10. As shown in FIG. 13, when the front rack-locating members 126 are affixed to the rack 10, a part of each of the front rack-locating members 236 extends beyond (i.e., laterally outwardly from) a respective lateral end of the base 22.

In this embodiment, the rack-locating members 236 are identical to one another and therefore only one of the rack-locating members 236 will be described in detail herein. It is to be understood that the same description applies to all of the rack-locating members 236.

Figure 17:
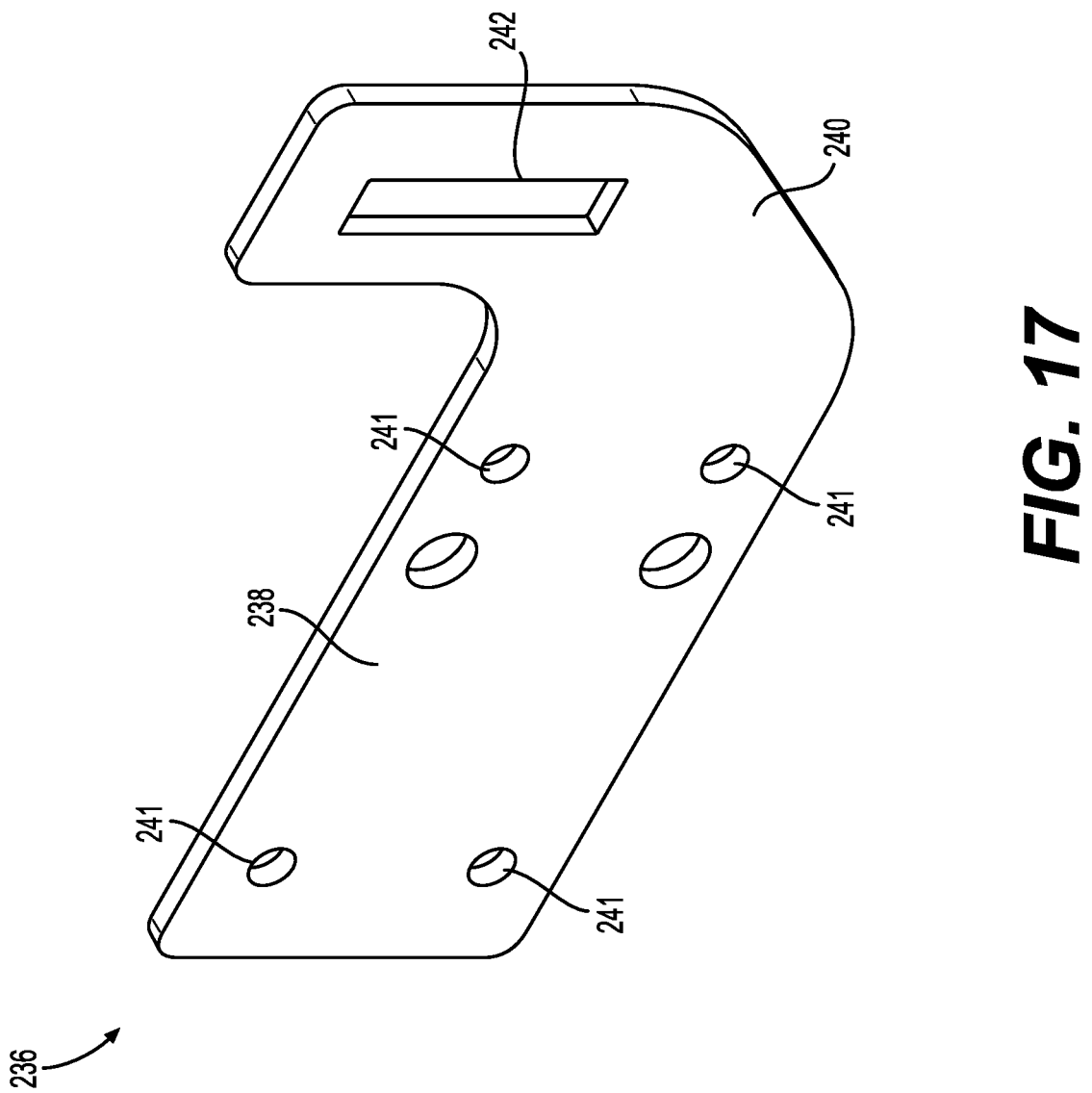
FIG. 17 is a perspective view of the rack-locating member of FIG. 14.

As shown in FIG. 17, the rack-locating member 236 is a plate member that is generally planar and includes a connecting portion 238 and an extending portion 240. The connecting portion 238 defines a plurality of openings 241 through which fasteners are inserted to connect the rack-locating member 236 to the base 22 of the rack 10. The extending portion 240 is that portion of the rack-locating member 236 that extends laterally outward past the lateral end of the base 22 when the rack-locating member 236 is connected to the base 22. As can be seen, in this embodiment, the extending portion 240 extends laterally and upwardly from the connecting portion 238.

Figure 15:
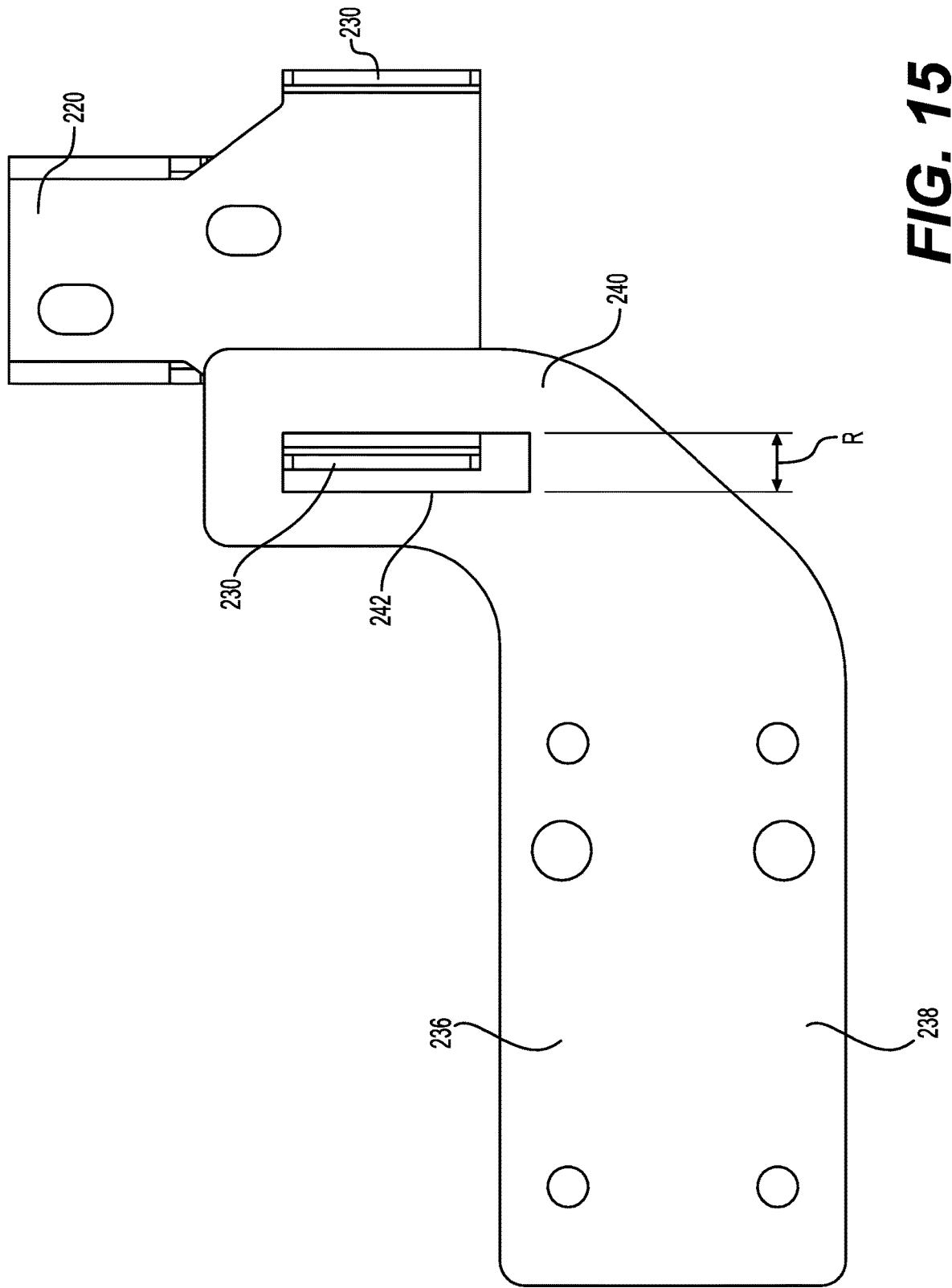
FIG. 15 is a front elevation view of the rack-locating member and guiding member of FIG. 14.
Figure 16:
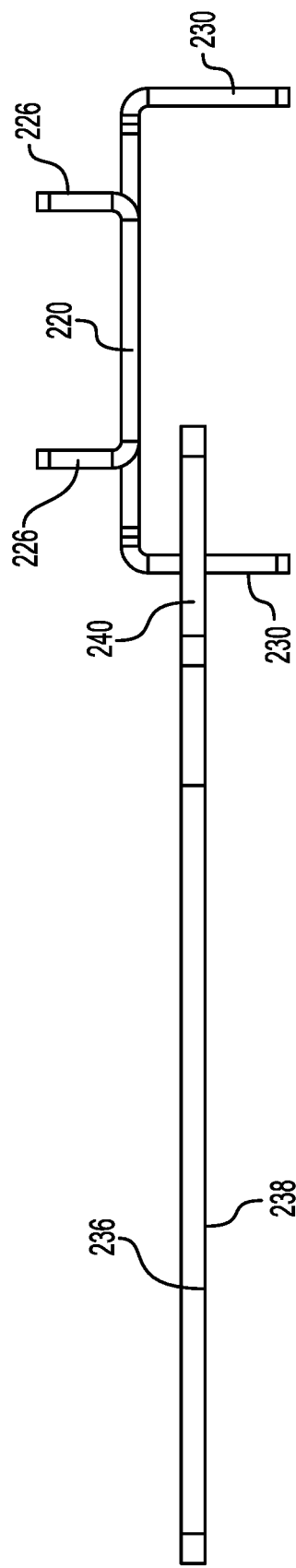
FIG. 16 is a top plan view of the rack-locating member and guiding member of FIG. 14.

As will be explained in more detail below, the extending portion 240 of the rack-locating member 236 has a locating feature 242 for locating a corresponding one of the guiding members 220 relative to the rack-locating member 236. In this embodiment, the locating feature 242 is a generally rectangular guide opening that is elongated in the vertical direction. As shown in FIG. 15, the guide opening 242 has a width R that is greater than a width of one of the projections 230 of the guiding members 220 (i.e., greater than a thickness of the sheet metal material of the guiding members 220).

With the front rack-locating members 236 affixed to the base 22 of the rack 10, the rack 10 is then lifted by the lifting machine so that the front rack-locating members 236 are vertically aligned with the front guiding members 220. The operator of the lifting machine then manoeuvres the lifting machine so that the rack 10 is aligned to be between the left and right vertical support units 104 in the lateral direction, and the rack 10 is then inserted between the left and right vertical support units 104 in a front-to-rear motion direction. That is, the rack 10 is moved between the left and right vertical support units 104 with the rear end 20 facing rearwardly and the front end 18 facing frontwardly. The rack 10 is inserted between the left and right vertical support units 104 in this direction so as to engage the front left and front right guiding members 220 with the guide openings 242 of the front left and front right rack-locating members 236, until the rear surfaces of the front left and front right rack-locating members 236 abut the front end surfaces of the central body portions 223 of the front left and front right guiding members 220 respectively. More specifically, as the rack 10 is being inserted between the left and right vertical support units 104, the laterally innermost projections 230 of the front left and front right guiding members 220 are inserted into the respective guide openings 242 of the front left and front right rack-locating members 236. The motion of the rack 10 is stopped when the front left and front right rack-locating members 236 abut the respective front left and front right guiding members 236. The abutment of the front rack-locating members 236 with the front guiding members 220 limits the position of the rack 10 along the depth direction, thereby ensuring that a center of gravity of the rack 10 is positioned appropriately along the depth direction to prevent significant weight imbalances in that direction (i.e., avoiding the rack 10 being too far rearward or too far frontward relative to the rack-supporting frame 102).

As will be understood, the lateral position of the rack 10 between the left and right vertical support units 104 is guided by interaction between the rack-locating members 236 and the guiding members 220. In particular, the lateral position of the rack 10 is limited to within a certain positional range by the insertion of the projections 230 into the guide openings 242. More specifically, as can be seen in FIG. 15, the width R of the guide openings 242 of the rack-locating members 236 limits the lateral position of the corresponding projections 230 therein thereby limiting the lateral position of the rack 10 to within the range permitted by the width R of the guide openings 242.

Before affixing the rear left and rear right rack-locating members 236 to the rack 10, the rear left and rear right rack-locating members 236 are placed, by hand by an operator, in engagement with the rear left and rear right guiding members 220 in order for the guide openings 242 of the rear left and rear right rack-locating members 236 to engage the laterally innermost projections 230 of the rear left and rear right guiding members 220. The rear left and rear right rack-locating members 236 are then affixed to the rear wall 67 of the base 22 of the rack 10, on the rear side of the rack 10. The position of the rear left and rear rack-locating members 236 is thus similar to that illustrated in FIGS. 14 to 16.

The rack 10 is then lowered so that the rack-locating members 236 are supported by the respective guiding members 220. Notably, the upper edges defining the openings 242 are resting atop the upper edges of the respective projections 230 of the guiding members 220.

This alternative method implementing the rack-locating members 236 and the guiding members 220 thus provides an easy and time-efficient manner of correctly positioning the rack 10 on the rack-supporting frame 10, namely ensuring that the rack 10 is correctly aligned in the lateral direction and the depth direction via interaction between the rack-locating members 236 and the guiding members 220. Furthermore, the design of the rack-locating members 236 may also be helpful prevent the rack 10 from tilting frontwards or rearwards as any tilting would be limited by a lower portion of the rack-locating members 236 coming into contact with the front or rear guiding members 220 and/or the vertical support units 104. For instance, when removing servers from the rack 10 from the front side thereof, the center of gravity of the rack 10 can be shifted frontwardly due to weight of the servers. Therefore, preventing the tilting of the rack 10 by the rack-locating member 236 can ensure safe maintenance operations on the rack 10.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A method for positioning a data center rack relative to a rack-supporting frame, the rack-supporting frame comprising left and right vertical support units laterally spaced apart from one another, the method comprising:
   affixing at least one left guiding member to the left vertical support unit such that:
      part of one of the at least one left guiding member extends frontwardly from a front end surface of the left vertical support unit; and
      part of one of the at least one left guiding member extends rearwardly from a rear end surface of the left vertical support unit;
   affixing at least one right guiding member to the right vertical support unit such that:
      part of one of the at least one right guiding member extends frontwardly from a front end surface of the right vertical support unit; and
      part of one of the at least one right guiding member extends rearwardly from a rear end surface of the right vertical support unit;
   affixing one front rack-locating member to a lateral end of a front side of the data center rack and affixing another front rack-locating member to an opposite lateral end of the front side of the data center rack;
   lifting the data center rack;
   inserting the data center rack between the left and right vertical support units until the at least one front rack-locating member abuts either (i) the front end surfaces of the left and right vertical support units, or (ii) the at least one left and right guiding members;
   affixing one rear rack-locating member to a lateral end of a rear side of the data center rack and affixing another rear rack-locating member to an opposite lateral end of the rear side of the data center rack; and
   lowering the data center rack so that:
      the one front rack-locating member is supported by the at least one left guiding member and the another front rack-locating member is supported by the at least one right guiding member; and
      the one rear rack-locating member is supported by the at least one left guiding member and the another rear rack-locating member is supported by the at least one right guiding member.

2. The method of claim 1, wherein a lateral position of the data center rack between the left and right vertical support units is guided by interaction between the front rack-locating members and the rear rack-locating members with the at least one left and at least one right guiding members.

3. The method of claim 1, wherein:
   each of the front rack-locating members and each of the rear rack-locating members has a locating feature for locating the at least one left guiding member and the at least one right guiding member relative thereto; and
   lowering the data center rack comprises engaging the at least one left guiding member and the at least one right guiding member with the locating feature of the front rack-locating members and the locating feature of the rear rack-locating members.

4. The method of claim 3, wherein engaging the at least one left guiding member and the at least one right guiding member with the locating feature of the front rack-locating members and the locating feature of the rear rack-locating members automatically guides the lateral position of the data center rack between the left and right vertical support units.

5. The method of claim 4, wherein:
   the locating feature is a V-shaped notch; and
   engaging the at least one left guiding member and the at least one right guiding member with the notches of the front rack-locating members and rear rack-locating members automatically guides the at least one left guiding member and the at least one right guiding member toward an apex of each of the notches so as to guide the lateral position of the data center rack between the left and right vertical support units.

6. The method of claim 1, wherein:
   each of the front rack-locating members has a first locating feature for locating at least one of the at least one left guiding member and the at least one right guiding member relative thereto; and
   the data center rack is inserted between the left and right vertical support units so as to engage the at least one left guiding member and the at least one right guiding member with the first locating feature of the front rack-locating members.

7. The method of claim 6, wherein:
   each of the rear rack-locating members has a second locating feature for locating the at least one left guiding member and the at least one right guiding member relative thereto; and the method further comprises:
prior to affixing the rear rack-locating members to the rear side of the data center rack, placing the rear rack-locating members in engagement with the at least one left guiding member and the at least one right guiding member in order for the second locating feature of each of the rear rack-locating members to engage a corresponding one of the at least one left guiding member and the at least one right guiding member.

8. The method of claim 6, wherein:
the first locating feature is a guide opening; and
said engaging the at least one left guiding member and the at least one right guiding member with the first locating feature of the front rack-locating members comprises inserting part of one of the at least one left guiding member and part of one of the at least one right guiding member into the respective guide opening of each of the front rack-locating members.

9. The method of claim 7, wherein:
the second locating feature is a guide opening; and
said engaging of the guiding opening of each of the rear rack-locating members with the corresponding one of the at least one left guiding member and the at least one right guiding member comprises inserting part of one of the at least one left guiding member and part of one of the at least one right guiding member into the respective guide opening of each of the rear rack-locating members.

10. The method of claim 6, wherein:
the at least one left guiding member includes a front left guiding member and a rear left guiding member;
the at least one right guiding member includes a front right guiding member and a rear right guiding member;
affixing the at least one left guiding member to the left vertical support unit comprises:
affixing the front left guiding member to the left vertical support unit such that at least part of the front left guiding member extends frontwardly from the front end surface of the left vertical support unit; and
affixing the rear left guiding member to the left vertical support unit such that at least part of the rear left guiding member extends rearwardly from the rear end surface of the left vertical support unit; and
affixing the at least one right guiding member to the right vertical support unit comprises:
affixing the front right guiding member to the right vertical support unit such that at least part of the front right guiding member extends frontwardly from the front end surface of the right vertical support unit; and
affixing the rear right guiding member to the right vertical support unit such that at least part of the rear right guiding member extends rearwardly from the rear end surface of the right vertical support unit.

11. The method of claim 1, wherein:
the at least one front rack-locating member includes a front left rack-locating member and a front right rack-locating member; and
affixing the at least one front rack-locating member to the front side of the data center rack comprises:
affixing the front left rack-locating member to a left end portion of the data center rack on the front side of the data center rack; and
affixing the front right rack-locating member to a right end portion of the data center rack on the front side of the data center rack.

12. The method of claim 1, wherein:
the at least one rear rack-locating member includes a rear left rack-locating member and a rear right rack-locating member; and
affixing the at least one rear rack-locating member to the rear side of the data center rack comprises:
affixing the rear left rack-locating member to a left end portion of the data center rack on the rear side of the data center rack; and
affixing the rear right rack-locating member to a right end portion of the data center rack on the rear side of the data center rack.

13. A rack system comprising:
a rack-supporting frame comprising a left vertical support unit and a right vertical support unit laterally spaced from one another;
at least one left guiding member connected to the left vertical support unit such that:
part of one of the at least one left guiding member extends frontwardly from a front end surface of the left vertical support unit; and
part of one of the at least one left guiding member extends rearwardly from a rear end surface of the left vertical support unit;
at least one right guiding member connected to the right vertical support unit such that:
part of one of the at least one right guiding member extends frontwardly from a front end surface of the right vertical support unit; and
part of one of the at least one right guiding member extends rearwardly from a rear end surface of the right vertical support unit;
a data center rack positioned between the left and right vertical support units of the rack-supporting frame;
one front rack-locating member connected to a lateral end of a front side of the data center rack and another front rack-locating member connected to an opposite lateral end of the front side of the data center rack, the front rack-locating members being respectively supported by the at least one left guiding member and the at least one right guiding member; and
one rear rack-locating member connected to a lateral end of a rear side of the data center rack, and another rear rack-locating member connected to an opposite lateral end of the front side of the data center rack, the rear rack-locating members being respectively supported by the at least one left guiding member and the at least one right guiding member,
each of the front rack-locating members and each of the rear rack-locating members having a locating feature for locating the at least one left guiding member and the at least one right guiding member relative thereto.

14. The rack system of claim 13, wherein a rear surface of each one of the front rack-locating members abuts either (i) the front end surface of at least one corresponding one of the left and right vertical support units, or (ii) at least one corresponding one of the at least one left guiding member and the at least one right guiding member.

15. The rack system of claim 13, wherein the locating feature automatically guides the lateral position of the data center rack between the left and right vertical support units.

16. The rack system of claim 15, wherein:
the locating feature is a V-shaped notch; and
the at least one left guiding member and the at least one right guiding member are guided toward an apex of each of the notches so as to guide the lateral position of the data center rack between the left and right vertical support units.

17. The rack system of claim 13, wherein:
the front rack-locating members include a front left rack-locating member and a front right rack-locating member;
the front left rack-locating member is connected to a left end portion of the data center rack on the front side of the data center rack;
the front right rack-locating member is connected to a right end portion of the data center rack on the front side of the data center rack;
the rear-rack locating members include a rear left rack-locating member and a rear right rack-locating member;
the rear left rack-locating member is connected to the left end portion of the data center rack on the rear side of the data center rack; and
the rear right rack-locating member is connected to the right end portion of the data center rack on the rear side of the data center rack.

18. The rack system of claim 13, wherein:
the locating feature is a guide opening; and
part of one of the at least one left guiding member and part of one the at least one right guiding member are inserted into a respective guide opening of each of the front rack-locating members and each of the rear rack-locating members.

19. The rack system of claim 18, wherein the part of each of the at least one left guiding member and the part of each of the at least one right guiding member protrudes frontwardly from the front end surface of a respective one of the left vertical support unit and the right vertical support unit.

20. The rack system of claim 13, wherein:
the at least one left guiding member includes a front left guiding member and a rear left guiding member;
the at least one right guiding member includes a front right guiding member and a rear right guiding member;
at least part of the front left guiding member extends frontwardly from the front end surface of the left vertical support unit;
at least part of the rear left guiding member extends rearwardly from the rear end surface of the left vertical support unit;
at least part of the front right guiding member extends frontwardly from the front end surface of the right vertical support unit; and
at least part of the rear right guiding member extends rearwardly from the rear end surface of the right vertical support unit.

* * * * *